(12) United States Patent
Wang et al.

(10) Patent No.: US 11,736,109 B2
(45) Date of Patent: Aug. 22, 2023

(54) SUCCESSIVE-APPROXIMATION REGISTER ANALOG-TO-DIGITAL CONVERTER CIRCUIT AND OPERATING METHOD THEREOF

(71) Applicant: M31 TECHNOLOGY CORPORATION, Hsinchu County (TW)

(72) Inventors: Hui Huan Wang, Hsinchu (TW); Meng Hsuan Wu, Hsinchu (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 210 days.

(21) Appl. No.: 17/355,181

(22) Filed: Jun. 23, 2021

(65) Prior Publication Data

US 2021/0399735 A1 Dec. 23, 2021

Related U.S. Application Data

(60) Provisional application No. 63/043,068, filed on Jun. 23, 2020.

(51) Int. Cl.
*H03M 1/38* (2006.01)
*H03L 7/08* (2006.01)
(Continued)

(52) U.S. Cl.
CPC .......... *H03L 7/0807* (2013.01); *H03K 3/037* (2013.01); *H03L 7/0893* (2013.01); *H03L 7/091* (2013.01);
(Continued)

(58) Field of Classification Search
CPC ..... H03L 7/0807; H03L 7/0893; H03L 7/091; H03L 7/0992; H03K 3/037
See application file for complete search history.

(56) References Cited

U.S. PATENT DOCUMENTS 9,143,153 B1 9/2015 Tai et al.
10,582,139 B2 * 3/2020 Takatsuka .............. H04N 25/76

FOREIGN PATENT DOCUMENTS

| CN | 104967451 B | 9/2017 |
|----|-------------|--------|
| CN | 110311663 A | 10/2019 |
| CN | 107017889 B | 4/2020 |

OTHER PUBLICATIONS

Liu, C. C., Chang, S. J., Huang, G. Y., & Lin, Y. Z. (2010). A 10-bit 50-MS/s SAR ADC with a monotonic capacitor switching procedure. IEEE Journal of Solid-State Circuits, 45(4), 731-740.

(Continued)

*Primary Examiner* — Joseph J Lauture
(74) *Attorney, Agent, or Firm* — WPAT, P.C., Intellectual Property Attorneys; Anthony King

(57) ABSTRACT

A successive-approximation register (SAR) analog-to-digital converter (ADC) circuit includes a comparator circuit and a plurality of latch circuits. The comparator circuit is configured to compare an analog signal with a plurality of reference levels. The latch circuits, coupled to the comparator circuit and connected in series, are triggered sequentially in response to a plurality of trigger signals, respectively, to store a comparator output of the comparator circuit and accordingly generate a digital signal. A first latch circuit and a second latch circuit of the latch circuits are triggered in response to a first trigger signal and a second trigger signal of the trigger signals, respectively. The first latch circuit is configured to generate the second trigger signal according to the comparator output stored in the first latch circuit.

19 Claims, 14 Drawing Sheets

(51) Int. Cl.
  *H03L 7/189* (2006.01)
  *H03L 7/091* (2006.01)
  *H03L 7/099* (2006.01)
  *H03L 7/089* (2006.01)
  *H03K 3/037* (2006.01)

(52) U.S. Cl.
  CPC .......... *H03L 7/0992* (2013.01); *H03L 7/0995* (2013.01); *H03L 7/189* (2013.01); *H03M 1/38* (2013.01)

(56) References Cited

OTHER PUBLICATIONS

Notice of Allowance and Search Report dated Mar. 15, 2022 issued by the Taiwan Intellectual Property Office for the Taiwanese counterpart patent application No. 110122972.
English Abstract Translations of CN107017889B, CN110311663A and CN104967451B.

* cited by examiner

SUCCESSIVE-APPROXIMATION REGISTER ANALOG-TO-DIGITAL CONVERTER CIRCUIT AND OPERATING METHOD THEREOF

PRIORITY CLAIM AND CROSS-REFERENCE

The present application claims priority to U.S. Provisional Patent Application No. 63/043,068, filed on Jun. 23, 2020, which is incorporated by reference herein in its entirety.

BACKGROUND

The present disclosure relates to signal conversion and, more particularly, to a successive-approximation register (SAR) analog-to-digital converter (ADC) circuit utilizing a plurality of latch circuits connected in series to implement a successive-approximation algorithm, and a method for operating a SAR ADC circuit.

Successive-approximation register (SAR) analog-to-digital converters (ADCs) are popular for system-on-chip (SoC) designs because of low power consumption, simple structure and small form factor. The basic principle of operation of SAR ADCs is to use a series of comparisons to implement a binary search algorithm, thereby determining each bit of a digital signal converted from an analog signal. The number of bit cycles needed for converting the analog input can be determined according to the resolution of the SAR ADC. To increase the sampling rate, several types of SAR ADCs have been proposed such as a multi-bit/step SAR ADC, a time-interleaved SAR ADC, an asynchronous SAR ADC and a SAR ADC using a non-binary search algorithm. For example, the asynchronous SAR ADC provides an internally generated clock to increase the sampling rate.

SUMMARY

The described embodiments provide a successive-approximation register (SAR) analog-to-digital converter (ADC) circuit utilizing a plurality of latch circuits connected in series to implement a successive-approximation algorithm, and a method for operating a SAR ADC circuit.

Some embodiments described herein may include a successive-approximation register (SAR) analog-to-digital converter (ADC) circuit. The SAR ADC circuit includes a comparator circuit and a plurality of latch circuits. The comparator circuit is configured to compare an analog signal with a plurality of reference levels. The latch circuits, coupled to the comparator circuit and connected in series, are triggered sequentially in response to a plurality of trigger signals, respectively, to store a comparator output of the comparator circuit and accordingly generate a digital signal. A first latch circuit and a second latch circuit of the latch circuits are triggered in response to a first trigger signal and a second trigger signal of the trigger signals, respectively. The first latch circuit is configured to generate the second trigger signal according to the comparator output stored in the first latch circuit.

Some embodiments described herein may include a successive-approximation register (SAR) analog-to-digital converter (ADC) circuit. The SAR ADC circuit includes a comparator circuit, N latch stages and (N−1) delay stages. N is an integer greater than one. The comparator circuit is configured to compare an analog signal with N reference levels in N comparison cycles respectively. The N latch stages, coupled to the comparator circuit, are configured to store a comparator output of the comparator circuit generated in the N comparison cycles as N data signals respectively, and accordingly generate a digital signal. Each latch stage is configured to output a first valid signal indicating if the data signal stored in the latch stage is valid. Each delay stage, coupled between two consecutive latch stages of the N latch stages, is configured to delay the first valid signal outputted from one of the two consecutive latch stages to generate a trigger signal, and trigger the other of the two consecutive latch stages according to the trigger signal.

Some embodiments described herein may include a method for operating a successive-approximation register (SAR) analog-to-digital converter (ADC) circuit. The method includes: utilizing a comparator circuit of the SAR ADC circuit to compare an analog signal with a plurality of reference levels during a plurality of successive comparison cycles, respectively, wherein the comparison cycles comprises a first comparison cycle and a second comparison cycle; enabling a first latch circuit to store an comparator output of the comparator circuit generated in the first comparison cycle, and accordingly generating a trigger signal; enabling a second latch circuit according to the trigger signal so as to store the comparator output generated in the second comparison cycle; and generating at least a portion of a digital signal according to the comparator output stored in the first latch circuit and the comparator output stored in the second latch circuit.

With the use of the proposed SAR control scheme, a latch circuit can be configured to trigger a next latch circuit according to a data signal latched therein. The next latch circuit can be triggered before a comparator output to be stored becomes valid. As a result, the proposed SAR control scheme can give more time margin to the DAC settling time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
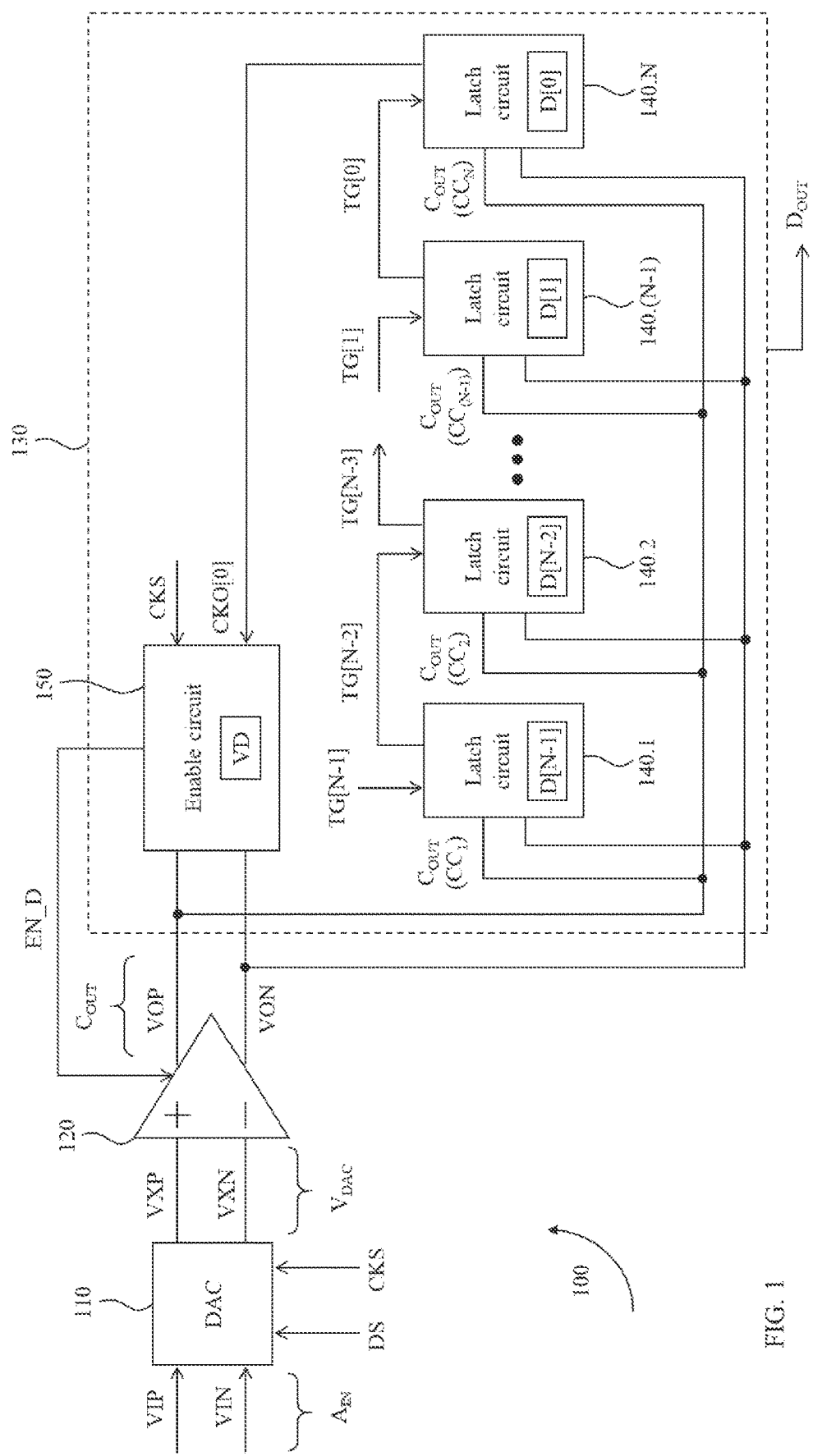
FIG. 1 is a block diagram illustrating an exemplary SAR ADC circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In order to provide sufficient time for a digital-to-analog converter (DAC) to settle, a SAR ADC circuit may wait for a time delay when a comparator output generated in a current comparison cycle reaches a valid logic state. The SAR ADC circuit will trigger a next comparison cycle after the time delay has elapsed. However, high speed SAR ADC architecture may give less time margin to the DAC settling time, which results in insufficient time allowed for the DAC to settle and causes conversion errors.

The present disclosure describes exemplary SAR ADC circuits, each of which includes a plurality of latch circuits connected in series to implement a successive-approximation algorithm. The latch circuits can serve as a portion of SAR control logic of the SAR ADC circuit. For example, an exemplary N-bit SAR ADC circuit may utilize N latch circuits connected in series to control digital-to-analog conversion. The N latch circuits are triggered sequentially to generate N bits of a digital signal respectively, wherein a latch circuit can generate a trigger signal according to a comparator output stored therein, and another latch circuit following the latch circuit can be triggered in response to the trigger signal generated by the latch circuit. In some embodiments, at least one latch circuit can be triggered before a comparator output stored therein becomes valid. As a result, when reaching a valid logic state, the comparator output can be stored in a corresponding latch circuit immediately. The time delay introduced by the SAR control logic can be reduced. The N-bit SAR ADC circuit can allow enough time for a DAC to settle. Further description is provided below.

FIG. 1 is a block diagram illustrating an exemplary SAR ADC circuit in accordance with some embodiments of the present disclosure. The SAR ADC circuit 100 is configured to convert an analog signal $A_{IN}$ to a digital signal $D_{OUT}$, which can be an N-bit digital code. N is an integer greater than one. The SAR ADC circuit 100 can be configured to sample the analog signal $A_{IN}$ during a sampling phase in a conversion cycle, and convert the analog signal $A_{IN}$ to the digital signal $D_{OUT}$ during a conversion phase after the sampling phase in the conversion cycle. Before a conversion result of the SAR ADC circuit 100 converges to a digital word, a signal level of the analog signal $A_{IN}$ may be compared with different quantization levels during the conversion phase.

The SAR ADC circuit 100 includes, but is not limited to, a DAC 110, a comparator circuit 120 and a control circuit 130. The DAC 110 can be configured to provide an analog signal $V_{DAC}$ according to the analog signal $A_{IN}$, a digital signal DS and at least one reference signal $V_{REF}$. In the present embodiment, the DAC 110 can be implemented using a capacitive DAC capable of providing an inherent sample and hold function. The analog signal $A_{IN}$ may be implemented as a plurality of voltage signals VIP and VIN, wherein a difference between the voltage signals VIP and VIN may represent the analog signal $A_{IN}$. The DAC 110 can perform sample and hold operations upon the analog signal $A_{IN}$ according to a control signal CKS, which is provided for controlling sampling of the analog signal $A_{IN}$. For example, at least one sampling switch of the DAC 110 (not shown in FIG. 1) can be selectively turned on according to the control signal CKS. The at least one sampling switch can be turned on during the sampling phase, and turned off during the conversion phase. In addition, the DAC 110 may output a plurality of voltage signals VXP and VXN, wherein a difference between the voltage signals VXP and VXN may represent the analog signal $V_{DAC}$. A signal level difference between the voltage signals VXP and VXN, i.e. a signal level of the analog signal $V_{DAC}$, can change in response to the digital signal DS. The at least one reference signal $V_{REF}$ may include at least one of a supply voltage, a ground voltage and a common-mode voltage.

The comparator circuit 120, coupled to the DAC 110, is configured to compare the analog signal $A_{IN}$ with N reference levels. In the present embodiment, the comparator circuit 120 is configured to compare the voltage signal VXP with the voltage signal VXN to thereby compare the analog signal $A_{IN}$ with the N reference levels. For example, the comparator circuit 120 may compare the voltage signal VXP with the voltage signal VXN multiple times in a plurality of comparison cycles. The signal level difference between the voltage signals VXP and VXN in one comparison cycle is different from that in another comparison cycle. By comparing the voltage signal VXP with the voltage signal VXN in different comparison cycles, the comparator circuit 120 can compare the analog signal $A_{IN}$ with different reference levels. In addition, the comparator circuit 120 may generate a comparator output $C_{OUT}$ in each comparison cycle. The comparator output $C_{OUT}$ can indicate if a signal level difference between the voltage signals VIP and VIN, i.e. a signal level of the analog signal $A_{IN}$, is greater than or less than one of the N reference levels. The comparator output $C_{OUT}$ may be implemented as a plurality of voltage signals VOP and VON.

The control circuit 130, coupled to the DAC 110 and the comparator circuit 120, is configured to generate the digital signal $D_{OUT}$ and the digital signal DS according to the comparator output $C_{OUT}$. The control circuit 130 is further configured to generate an enable signal EN_D to selectively enable the comparator circuit 120. A comparison cycle starts each time the comparator circuit 120 is enabled. When the comparator circuit 120 is disabled, the comparator circuit $C_{OUT}$ may be reset.

The control circuit 130 includes, but is not limited to, a plurality of latch circuits 140.1-140.N and an enable circuit 150. The latch circuits 140.1-140.N are coupled to the comparator circuit 120 and connected in series. The latch circuits 140.1-140.N can be triggered sequentially in response to a plurality of trigger signals TG[N−1]-TG[0], respectively, to store the comparator output $C_{OUT}$ and accordingly generate the digital signal $D_{OUT}$. For example, the latch circuits 140.1-140.N may store the comparator output $C_{OUT}$ as N data signals D[N−1]-D[0], and generate the digital signal $D_{OUT}$ according to the N data signals D[N−1]-D[0].

Additionally, a latch circuit can be configured to generate a trigger signal, used for triggering another latch circuit following the latch circuit, according to the comparator output $C_{OUT}$ stored in the latch circuit. For example, the latch circuit 140.1 can be triggered first to store the comparator output $C_{OUT}$, and accordingly generate a most significant bit (MSB) of the digital signal $D_{OUT}$. The latch circuit 140.1 can generate the trigger signal TG[N−2] according to the comparator output $C_{OUT}$ stored therein, i.e. the data signal D[N−1]. Next, the latch circuit 140.2 can be triggered in response to the trigger signal TG[N−2] to store the comparator output $C_{OUT}$.

In the present embodiment, the comparator circuit 120 can be configured to compare the analog signal $A_{IN}$ with the N reference levels in N successive comparison cycles $CC_1$-$CC_N$, respectively. The latch circuits 140.1-140.N can be configured to store the comparator output $C_{OUT}$ generated in the N comparison cycles $CC_1$-$CC_N$, respectively. At least one of the latch circuits 140.1-140.N can be triggered before the comparator output $C_{OUT}$ generated in a corresponding comparison cycle becomes valid. The comparator output $C_{OUT}$ may be regarded as being valid when reaching a valid logic state.

For example, the latch circuit 140.1 can be triggered in response to the trigger signal TG[N−1] before the comparator output $C_{OUT}$ to be stored is generated or becomes valid. When the signal level difference between the voltage signals VOP and VON reaches a threshold level, it means that the comparator output $C_{OUT}$ becomes valid. It is worth noting that once the comparator output $C_{OUT}$ becomes valid, the latch circuit 140.1 can latch the comparator output $C_{OUT}$ without or almost without delay. The control circuit 130 can reserve more time for settling the DAC 110. In some embodiments, the trigger signal TG[N−1] may be implemented using the control signal CKS. When the control signal CKS indicates that the sampling of the analog signal $A_{IN}$ is performed or unfinished, the latch circuit 140.1 is untriggered. When the control signal CKS indicates that the sampling of the analog signal $A_{IN}$ is finished, the latch circuit 140.1 is triggered.

Similarly, the latch circuit 140.2 can be triggered in response to the trigger signal TG[N−2] before the comparator output $C_{OUT}$ to be stored is generated or becomes valid. In some embodiments, the latch circuit 140.2 can be triggered before the comparator circuit 120 enters a comparison cycle, in which the comparator output $C_{OUT}$ to be stored by the latch circuit 140.2 is generated. It is worth noting that when the latch circuit 140.2 is triggered in response to the trigger signal TG[N−2] to store the comparator output $C_{OUT}$, the latch circuit 140.1 may be uncoupled from the comparator output $C_{OUT}$ to keep the data signal D[N−1] stored therein from being disturbed by the following comparisons. Similarly, when the latch circuit 140.N is triggered in response to the trigger signal TG[0] to store the comparator output $C_{OUT}$, each of the latch circuits 140.1-140.(N−1) may be uncoupled from the comparator output $C_{OUT}$.

The enable circuit 150, coupled to the comparator circuit 120, is configured to generate the enable signal EN_D at least by detecting if the comparator output $C_{OUT}$ is valid. The comparator circuit 120 can be selectively enabled according to the enable signal EN_D. For example, the enable circuit 150 may generate a valid signal VD by detecting if the signal level difference between the voltage signals VOP and VON reaches a threshold level. When the level difference between the voltage signals VOP and VON reaches the threshold level, the valid signal VD can indicate that the comparator output $C_{OUT}$ is valid. The enable circuit 150 can be configured to generate the enable signal EN_D to disable the comparator circuit 120 to thereby reset the comparator output $C_{OUT}$. The comparator circuit 120 may prepare for entering a next comparison cycle.

In some embodiments, the enable circuit 150 can be configured to generate the enable signal EN_D according to the control signal CKS. For example, when the control signal CKS indicates that the sampling of the analog signal $A_{IN}$ is performed, the enable circuit 150 can be configured to generate the enable signal EN_D to disable the comparator circuit 120 to thereby reset the comparator output $C_{OUT}$. In some embodiments, the enable circuit 150 can be configured to generate the enable signal EN_D according to a valid signal CKO[0], which can indicate if the data signal D[0] latched in the latch circuit 140.N is valid. The latch circuit 140.N can be configured for generating a least significant bit (LSB) of the digital signal $D_{OUT}$. For example, when the valid signal CKO[0] indicates that the data signal D[0] is valid, the enable circuit 150 can be configured to generate the enable signal EN_D to disable the comparator circuit 120 to thereby reset the comparator output $C_{OUT}$.

Figure 2:
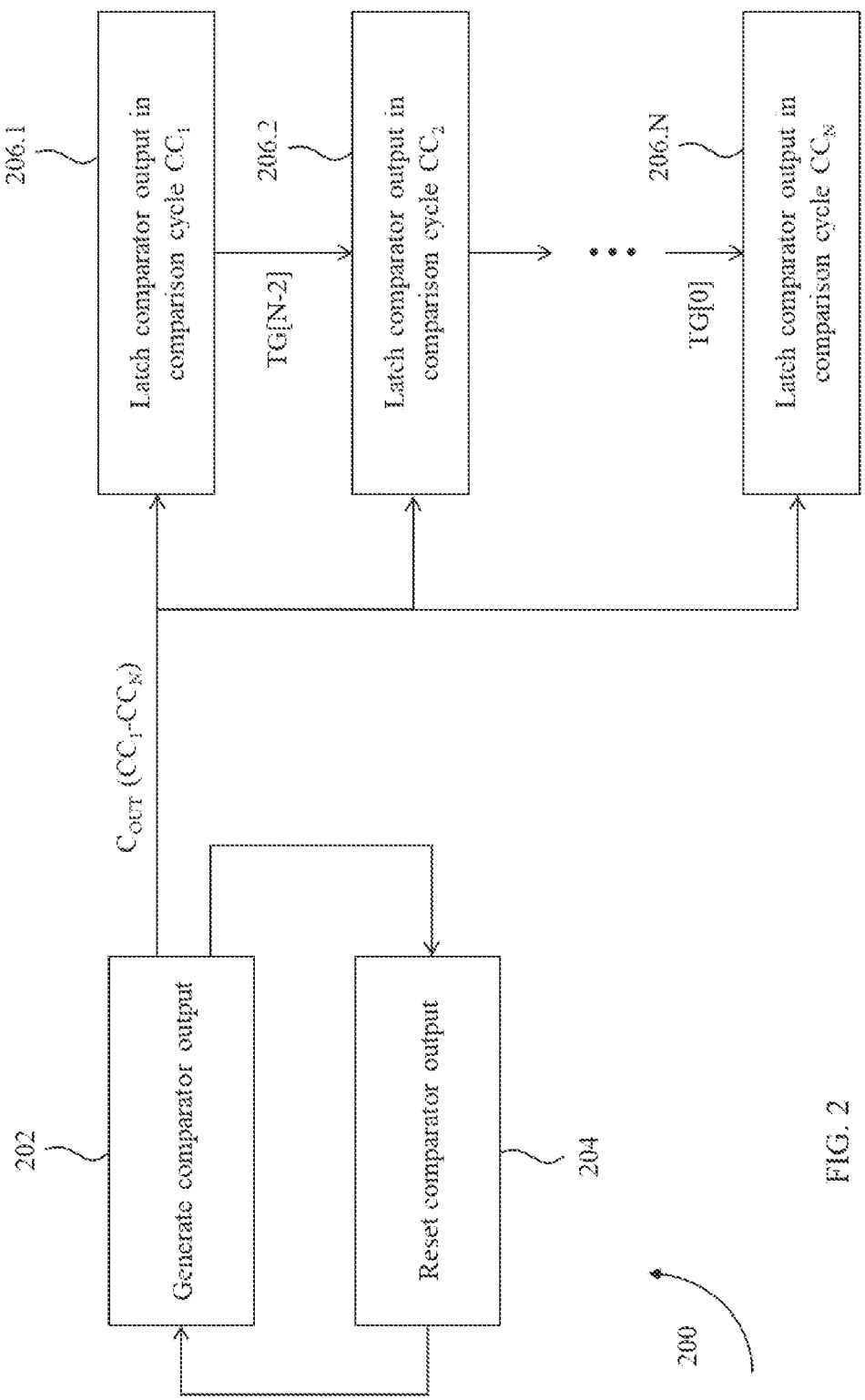
FIG. 2 is a flow chart of an exemplary method for operating a SAR ADC circuit in accordance with some embodiments of the present disclosure.

FIG. 2 is a flow chart of an exemplary method for operating a SAR ADC circuit in accordance with some embodiments of the present disclosure. The method 200 can be employed in the SAR ADC circuit 100 shown in FIG. 1 to give more time margin to the DAC settling time. For illustrative purposes, the method 200 is described below with reference to the SAR ADC circuit 100 shown in FIG. 1. It is worth noting that the method 200 can be employed in other SAR ADC circuits without departing from the scope of the present disclosure. Additionally, in some embodiments, other operations in the method 200 can be performed. In some other embodiments, operations of the method 200 can be performed in a different order and/or vary.

At operation 202, an analog signal is compared with N different reference levels during N successive comparison cycles, respectively, to generate a comparator output in each comparison cycle. For example, the comparator circuit 120 is configured to compare the analog signal $A_{IN}$ with a reference level by comparing the voltage signal VXP with the voltage signal VXN in the comparison cycle $CC_1$, and compare the analog signal $A_{IN}$ with another reference level by comparing the voltage signal VXP with the voltage signal VXN in the comparison cycle $CC_2$. The signal level difference between the voltage signals VXP and VXN in the comparison cycle CC is different from that in the comparison cycle $CC_2$. The comparator output $C_{OUT}$ obtained in each comparison cycle is available or ready for use when reaching a logic valid state.

At operation 204, the comparator output is reset. For example, after the latch circuit 140.1 stores the comparator output $C_{OUT}$ generated in the comparator $CC_1$ as the data signal D[N−1], the comparator circuit 120 may reset the comparator output $C_{OUT}$ according to the enable signal EN_D. The voltage signals VOP and VON may be at the same or substantially the same signal level when the comparator output $C_{OUT}$ is reset.

At operation 206.1-206.N, N latch circuits of the SAR ADC circuit can be triggered sequentially to store the comparator output generated in the N successive comparison cycles, respectively. At operation 206.1, the latch circuit 140.1 is configured to store the comparator output $C_{OUT}$, which is generated in the comparison cycle $CC_1$ and ready for use, and accordingly generate the data signal D[N−1]. At operation 206.2, the latch circuit 140.2 is triggered at least according to the data signal D[N−1] latched in the latch circuit 140.1, thereby storing the comparator output $C_{OUT}$, which is generated in the comparison cycle $CC_2$ and ready for use. For example, when the data signal D[N−1] is valid, the latch circuit 140.1 can be configured to generate the trigger signal TG[N−2] to trigger the latch circuit 140.2. As another example, when the data signal D[N−1] is valid, and the comparator output $C_{OUT}$ generated in the comparison cycle $CC_1$ is reset or becomes not ready, the latch circuit 140.1 can be configured to generate the trigger signal TG[N−2] to trigger the latch circuit 140.2. Similarly, at operation 206.N, the latch circuit 140.N is triggered at least according to the data signal D[1] latched in the latch circuit 140.(N−1), thereby storing the comparator output $C_{OUT}$, which is generated in the comparison cycle $CC_N$ and ready for use.

With the use of the N latch circuits connected in series, a latch circuit can be configured to trigger a next latch circuit according to a data signal latched therein. The next latch circuit can be triggered before a comparator output to be stored becomes valid. For example, the latch circuit 140.2 can be triggered by the latch circuit 140.1 in the comparison cycle CC. As a result, when becoming valid, the comparator output $C_{OUT}$ generated in the comparison cycle $CC_2$ can be immediately stored in the latch circuit 140.2. The proposed SAR control scheme can give more time margin to the DAC settling time.

The circuit structure shown in FIG. 1 are provided for illustrative purposes, and are not intended to limit the scope of the present disclosure. For example, the DAC 110 shown in FIG. 1 can be implemented using a sample and hold circuit and a DAC separated from each other. The comparator circuit 120 shown in FIG. 1 can be configured to compare an output of the sample and hold circuit with an output of the DAC to generate the comparator output $C_{OUT}$. As long as SAR control logic includes a plurality of latch circuits connected in series, and a latch circuit is configured to trigger a next latch circuit according to data latched therein, associated modifications and alternatives are contemplated to fall within the scope of the present disclosure.

To facilitate understanding of the present disclosure, some embodiments are given as follows for further description of the proposed SAR control scheme. Those skilled in the art should appreciate that other embodiments employing the circuit structure of the control circuit 130 shown in FIG. 1 are also within the contemplated scope of the present disclosure.

Figure 3:
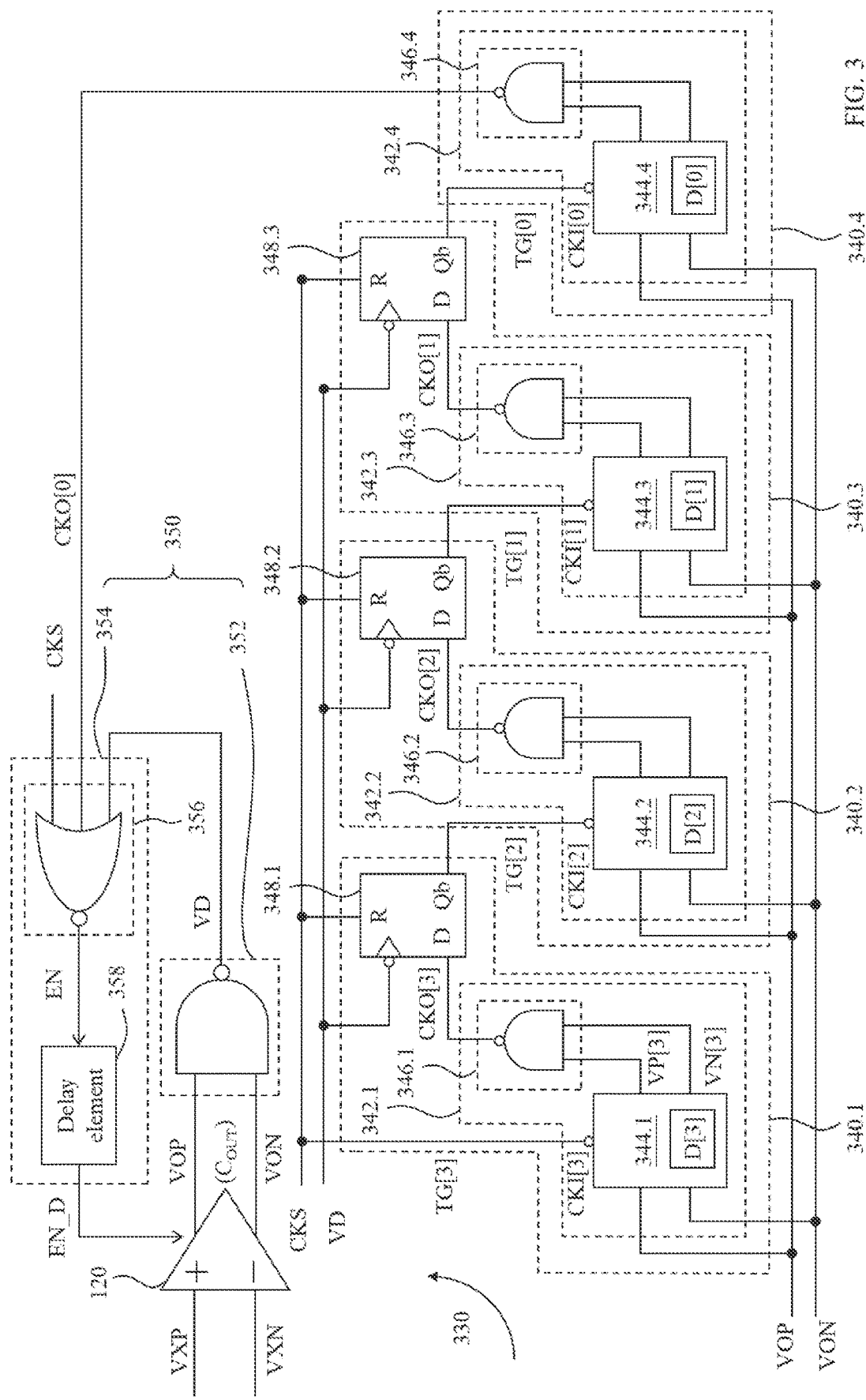
FIG. 3 illustrates an implementation of the control circuit shown in FIG. 1 in accordance with some embodiments of the present disclosure.

FIG. 3 illustrates an implementation of the control circuit 130 shown in FIG. 1 in accordance with some embodiments of the present disclosure. In the present embodiment, the control circuit 330 can be implemented as at least a portion of SAR control logic of a 4-bit SAR ADC circuit, such as an implementation of the SAR ADC circuit 100 shown in FIG. 1 (N=4). The control circuit 330 includes a plurality of latch circuits 340.1-340.4 and an enable circuit 350. The latch circuits 340.1-340.4 can represent an embodiment of the latch circuits 140.1-140.N shown in FIG. 1. The enable circuit 350 can represent an embodiment of the enable circuit 150 shown in FIG. 1.

Each of the latch circuits 340.1-340.3 may be implemented using a latch stage and a delay stage connected in series, while the latch circuit 340.4 may be implemented using a latch stage. The latch stages 342.1-342.4 can be triggered in response to the trigger signals TG[3]-TG[0], respectively, to store the comparator output $C_{OUT}$ generated in the comparison cycles $CC_1$-$CC_4$, respectively. Also, the latch stages 342.1-342.4 can generate the digital signal $D_{OUT}$ according to the comparator output $C_{OUT}$ generated in the comparison cycles $CC_1$-$CC_4$. Each latch stage can be configured to output a valid signal, i.e. one of the valid signals CKO[3]-CKO[0]. The valid signal can indicate if the comparator output $C_{OUT}$ stored in the latch stage is valid.

For example, each of the latch stages 342.1-342.4 may include a data latch and a signal detector, i.e. one of the data latches 344.1-344.4 and one of the signal detectors 346.1-346.4. With regard to the latch stage 342.1, the data latch 344.1 is configured to, when triggered by a trigger signal CKI[3], store the comparator $C_{OUT}$ obtained in the comparator cycle $CC_1$ to thereby generate the data signal D[3]. In the present embodiment, the trigger signal CKI[3] can be an inverted signal of the trigger signal TG[3]. The trigger signal TG[3] can be implemented using the control signal CKS, which is provided for controlling the sampling of the analog signal $A_{IN}$ shown in FIG. 1.

The signal detector 346.1, coupled to the data latch 344.1, is configured to detect the data signal D[3] to generate the valid signal CKO[3]. The valid signal CKO[3] may indicate if the data signal D[3], i.e. the comparator output $C_{OUT}$ stored in the data latch 344.1, is valid. For example, the data signal D[3] may include a plurality of voltage signals VP[3] and VN[3]. The signal detector 346.1 can generate the valid signal CKO[3] by detecting if a signal level difference between the voltage signals VP[3] and VN[3] reaches a threshold level. When the signal level difference between the voltage signals VP[3] and VN[3] reaches the threshold level, the valid signal CKO[3] may indicate that the data signal D[3] is valid. When the signal level difference between the voltage signals VP[3] and VN[3] is less than the threshold level, the valid signal CKO[3] may indicate that the data signal D[3] is invalid. In the present embodiment, the signal detector 346.1 can be implemented using a NAND gate configured to receive the voltage signals VP[3] and VN[3] to generate the valid signal CKO[3]. However, this is not intended to limit the scope of the present disclosure. The signal detector 346.1 can be implemented using other types of detector circuits capable of detecting if the data signal D[3] is valid.

Similarly, the data latch 344.2/344.3/344.4 can be triggered by the trigger signal CKI[2]/CKI[1]/CKI[0], which can be an inverted signal of the trigger signal TG[2]/TG[1]/TG[0]. When triggered by the trigger signal CKI[2]/CKI[1]/CKI[0], the data latch 344.2/344.3/344.4 can configured to store the comparator $C_{OUT}$ obtained in the comparator cycle $CC_2$/$CC_3$/$CC_4$, to thereby generate the data signal D[2]/D[1]/D[0]. The signal detector 346.2/346.3/346.4 can be configured to detect the data signal D[2]/D[1]/D[0] to generate the valid signal CKO[2]/CKO[1]/CKO[0]. The valid signal CKO[2]/CKO[1]/CKO[0] may indicate if the data signal D[2]/D[1]/D[0] is valid.

Each of the delay stages 348.1-348.3, coupled between two consecutive latch stages of the latch stages 342.1-342.4, is configured to delay a valid signal outputted from one of the two consecutive latch stages to generate a trigger signal, and trigger the other of the two consecutive latch stages according to the trigger signal. For example, the delay stage 348.1, coupled between two consecutive latch stages 342.1 and 342.2, is configured to delay the valid signal CKO[3] outputted from the latch stage 342.1 to generate the trigger signal TG[2], and trigger the latch stage 342.2 according to the trigger signal TG[2]. Similarly, the delay stage 348.2 is configured to delay the valid signal CKO[2] outputted from the latch stage 342.2 to generate the trigger signal TG[1], and trigger the latch stage 342.3 according to the trigger signal TG[1]. The delay stage 348.3 is configured to delay the valid signal CKO[1] outputted from the latch stage 342.3 to generate the trigger signal TG[0], and trigger the latch stage 342.4 according to the trigger signal TG[0].

In the present embodiment, the latch circuit 340.1 can be configured to send out the trigger signal TG[2] to the latch circuit 340.2 according to the valid signal VD. When the valid signal VD indicates that the comparator output $C_{OUT}$ is valid, the trigger signal TG[2] is not sent out to the latch circuit 340.2. When the valid signal VD indicates that the comparator output $C_{OUT}$ becomes invalid, the trigger signal TG[2] is sent out to the latch circuit 340.2. As a result, the latch circuit 340.2 can be triggered immediately after the comparator output $C_{OUT}$ is reset in a previous comparison cycle. Similarly, the latch circuit 340.3/340.4 can be triggered immediately after the comparator output $C_{OUT}$ is reset in a previous comparison cycle.

By way of example but not limitation, each of the delay stages 348.1-348.3 can be implemented using a flip-flop, which is triggered in response to the valid signal VD. The valid signal VD can indicate if the comparator output $C_{OUT}$ is valid. When the valid signal VD indicates that the comparator output $C_{OUT}$ becomes invalid, the flip-flop can be configured to output the trigger signal TG[2]/TG[1]/TG[0] according to the valid signal VD. In the present embodiment, the flip-flop can be triggered by a falling edge of the valid signal VD. A data input D of the flip-flop is coupled to the valid signal CKO[3]/CKO[2]/CKO[1]. An inverse data output Qb of the flip-flop is configured to output the trigger signal TG[2]/TG[1]/TG[0]. Additionally, the flip-flop may be reset when the analog signal $A_{IN}$ shown in FIG. 1 is sampled by the comparator circuit 120. For example, a reset input R of the flip-flop can be coupled to the control signal CKS.

The enable circuit 350 includes, but is not limited to, a signal detector 352 and a signal generator 354. The signal detector 352 is configured to detect the comparator output $C_{OUT}$ to generate the valid signal VD, which can indicate if the comparator output $C_{OUT}$ is valid. By way of example but not limitation, the signal detector 352 can be implemented using a NAND gate, which is configured to generate the valid signal VD according to the voltage signals VOP and VON.

The signal generator 354, coupled to the signal detector 352, the latch circuit 340.4 and the comparator circuit 120, is configured to generate the enable signal EN_D according to the valid signal VD, the valid signal CKO[0] and the control signal CKS. Also, the signal generator 354 can be configured to selectively enable the comparator circuit 120 according to the enable signal EN_D.

In the present embodiment, when the valid signal VD indicates that the comparator output $C_{OUT}$ is invalid, the valid signal CKO[0] indicates that the data signal D[0] latched in the latch circuit 340.4 is invalid, and the control signal CKS indicates that the sampling of the analog signal $A_{IN}$ shown in FIG. 1 is finished, the signal generator 354 can enable the comparator circuit 120 according to the enable signal EN_D. When the valid signal VD indicates that the comparator output $C_{OUT}$ is valid, the signal generator 354 can disable the comparator circuit 120 such that the comparator output $C_{OUT}$ can be reset. When the valid signal CKO[0] indicates that the data signal D[0] latched in the latch circuit 340.4 is valid, the signal generator 354 can disable the comparator circuit 120 such that the comparator output $C_{OUT}$ can be reset. When the control signal CKS indicates that the sampling of the analog signal $A_{IN}$ shown in FIG. 1 is unfinished, the signal generator 354 can disable the comparator circuit 120 such that the comparator output $C_{OUT}$ can be reset. By way of example but not limitation, the signal generator 354 can be implemented to include a NOR gate 356 and a delay element 358. The NOR gate 356 is configured to generate an enable signal EN according to the valid signal VD, the valid signal CKO[0] and the control signal CKS. The delay element 358 is configured to delay the enable signal EN to generate the enable signal EN_D.

Figure 4:
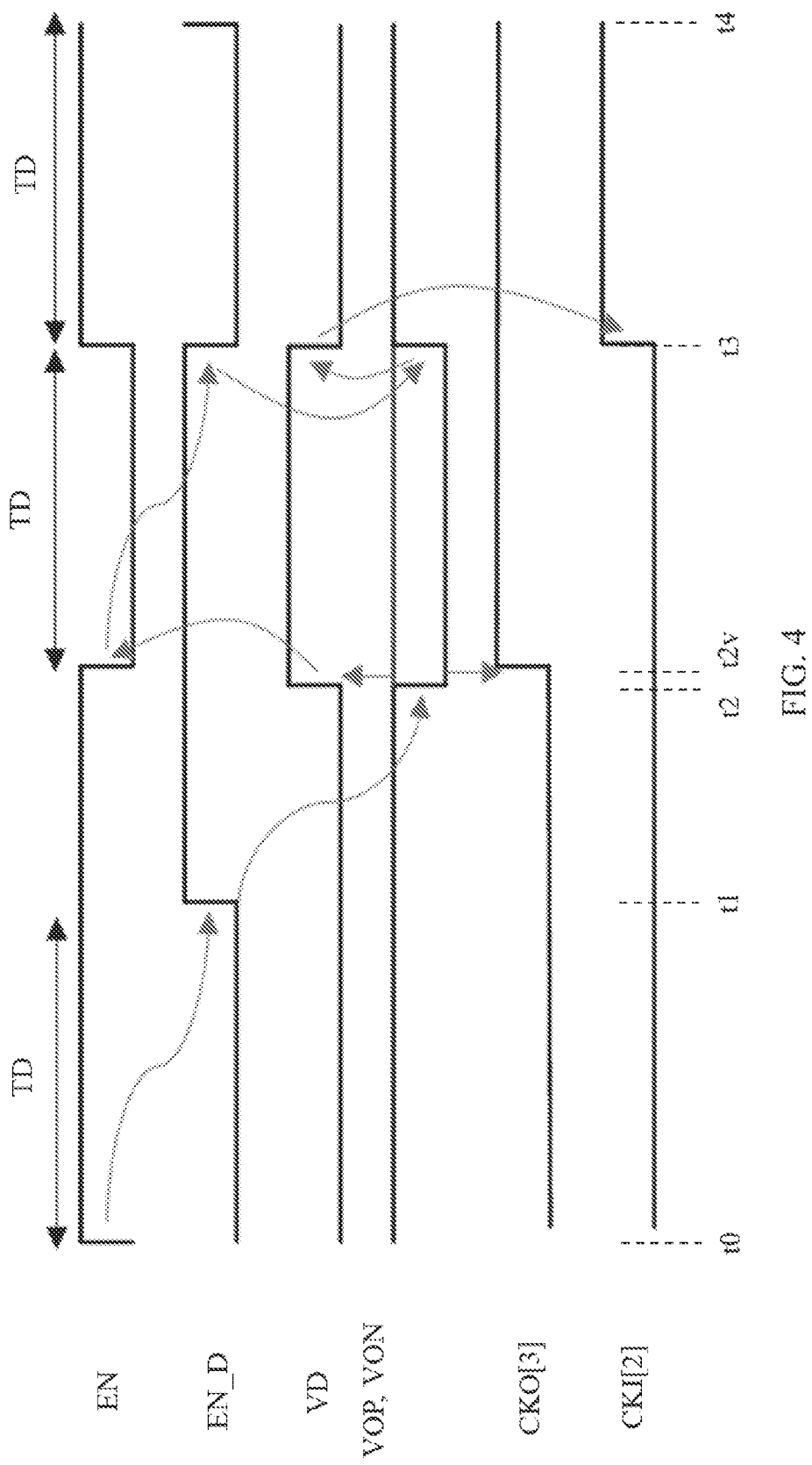
FIG. 4 illustrates signal waveforms associated with operation of the control circuit shown in FIG. 3 in accordance with some embodiments of the present disclosure.

FIG. 4 illustrates signal waveforms associated with operation of the control circuit 330 shown in FIG. 3 in accordance with some embodiments of the present disclosure. Referring to FIG. 4 and also to FIG. 3, at time t0, the enable signal EN_D transitions to a high signal level. For example, a sampling phase ends and a conversion phase starts, such that the sampling of the analog signal $A_{IN}$ shown in FIG. 1 is finished. The control signal CKS can transition from a high signal level to a low signal level. As each of the control signal CKS, the valid signal CKO[0] and the valid signal VD is at a low signal level, the NOR gate 356 can output the enable signal EN at a high signal level to the delay element 358.

After a time delay TD introduced by the delay element 358, i.e. at time t1, the delay element 358 may generate the enable signal EN_D at a high signal level. The comparator circuit 120 can be enabled by the enable signal EN_D to enter the comparison cycle CC. Before the comparator output $C_{OUT}$ generated in the comparison cycle $CC_1$ becomes valid, the latch stage 342.1 can be triggered because the control signal CKS has transitioned to a low signal level.

At time t2, the signal level difference between the voltage signals VOP and VON reaches a threshold level. The signal detector 352 can generate the valid signal VD at a high signal level accordingly. The enable signal EN outputted from the NOR gate 356 can transition to a low signal level. Additionally, as the latch stage 342.1 has been triggered, the data latch 344.1 can immediately store the comparator output $C_{OUT}$ which reaches a valid logic state, and the signal detector 346.1 can generate the valid signal CKO[3] at a high signal level at time t2v. The latch circuit 340.1 can generate an MSB of the digital signal $D_{OUT}$ shown in FIG. 1 according to the data signal D[3] stored therein.

After the time delay TD, i.e. at time t3, the enable signal EN_D may transition to a low signal level in response to the enable signal EN. The comparator circuit 120 may reset the comparator output $C_{OUT}$ according to the enable signal EN_D, such that the voltage signals VOP and VON may be at a same signal level. The valid signal VD transitions to a low signal level, and the enable signal EN_D transitions to a high signal level. In addition, the delay stage 348.1, i.e. the flip-flop, can be trigged by the valid signal VD to output the trigger signal TG[2]. The latch stage 342.2 can be trigged by the trigger signal CKI[2], which is an inverted signal of the trigger signal TG[2]. After the time delay TD, i.e. at time t4, the enable signal EN_D may transition to a high signal level. The comparator circuit 120 can enter the comparison cycle $CC_2$.

As the latch stage 342.2 can be trigged in response to the valid signal CKO[3] outputted from the preceding latch stage 342.1 and the valid signal VD, SAR control logic implemented based on the structure of the latch circuits 340.1-340.4 can be referred to as two-path SAR control logic. As those skilled in the art can understand operation of the control circuit 330 in the comparison cycles $CC_2$-$CC_4$ after reading the above paragraphs directed to FIG. 1 to FIG. 4, similar description is not repeated here for brevity.

It is worth noting that as the comparator output $C_{OUT}$ generated in the comparison cycle $CC_1$ can be immediately stored in the latch circuit 340.1 when becoming valid, a period of time reserved for a DAC to settle is substantially equal to two times the time delay TD. Compared to SAR control logic which enables storage of a comparator output when the comparator output becomes valid, the proposed SAR control logic can give more time margin to the DAC settling time.

Figure 5:
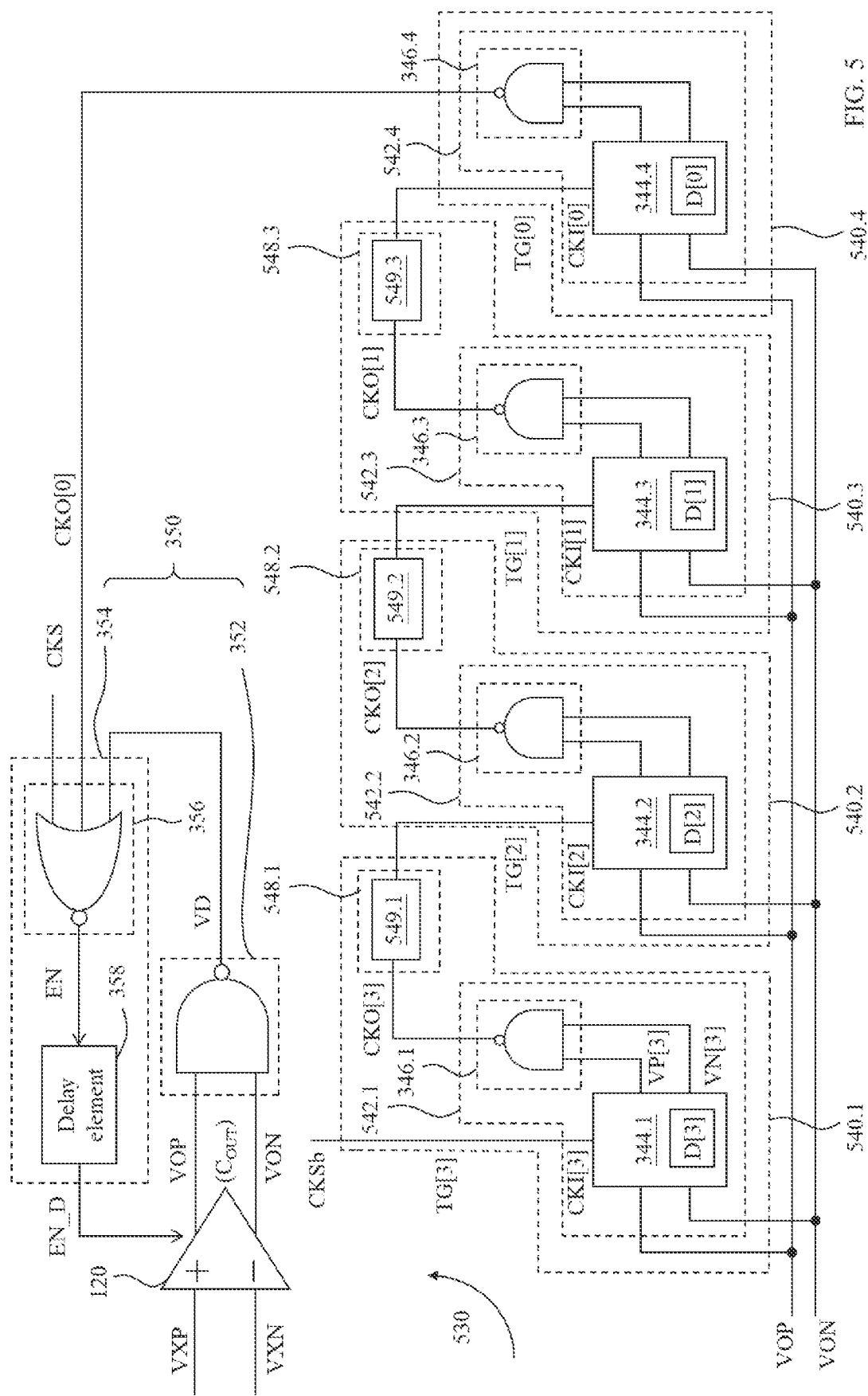
FIG. 5 illustrates another implementation of the control circuit shown in FIG. 1 in accordance with some embodiments of the present disclosure.

FIG. 5 illustrates another implementation of the control circuit 130 shown in FIG. 1 in accordance with some embodiments of the present disclosure. The circuit structure of the control circuit 530 may be identical/similar to that of the control circuit 330 shown in FIG. 3 except for the latch circuits 540.1-540.4.

The latch circuit 540.1 includes a latch stage 542.1 and a delay stage 548.1 coupled in series. The latch stage 542.1 includes the data latch 344.1 and the signal detector 346.1 shown in FIG. 3. The trigger signal CKI[3] used for triggering the data latch 344.1 is implemented using a control signal CKSb, which is an inverted signal of the control signal CKS. The delay stage 548.1 is implemented using a delay element 549.1, which is configured to delay the valid signal CKO[3] to generate the trigger signal CKI[2].

The latch circuit 540.2 includes a latch stage 542.2 and a delay stage 548.2 coupled in series. The latch stage 542.2 includes the data latch 344.2 and the signal detector 346.2 shown in FIG. 3. The trigger signal CKI[2] used for triggering the data latch 344.2 is outputted from the delay stage 548.1. The delay stage 548.2 is implemented using a delay element 549.2, which is configured to delay the valid signal CKO[2] to generate the trigger signal CKI[1]. Similarly, the latch circuit 540.3 includes a latch stage 542.3 and a delay stage 548.3 coupled in series. The trigger signal CKI[1] used for triggering the data latch 344.3 is outputted from the delay stage 548.2. The delay stage 548.3 is implemented using a delay element 549.3, which is configured to delay the valid signal CKO[1] to generate the trigger signal CKI[0]. In addition, the latch circuit 540.4 is implemented using a latch stage 542.4, which includes the data latch 344.4 and the signal detector 346.4 shown in FIG. 3. The trigger signal CKI[0] used for triggering the data latch 344.4 is outputted from the delay stage 548.3.

Figure 6:
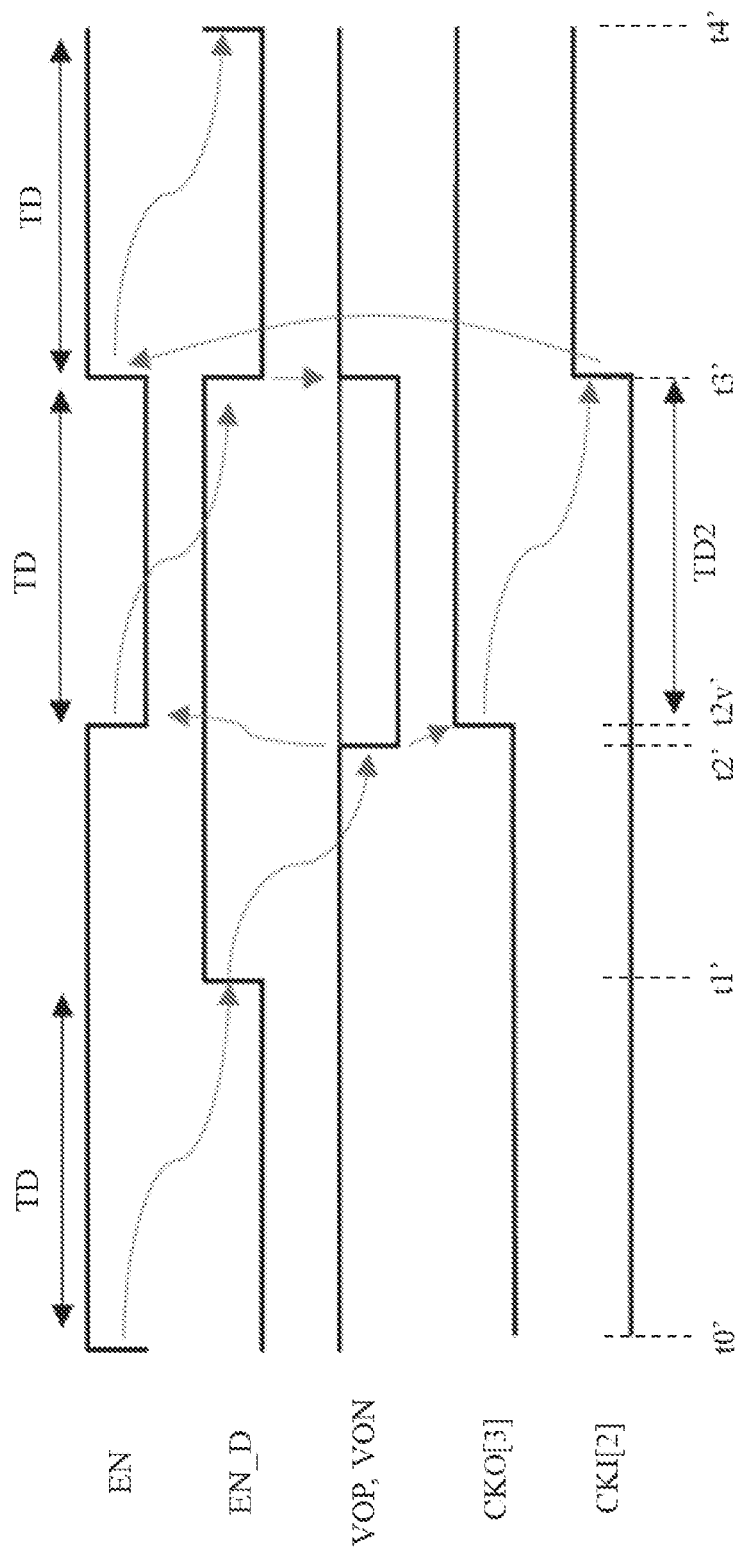
FIG. 6 illustrates signal waveforms associated with operation of the control circuit shown in FIG. 5 in accordance with some embodiments of the present disclosure.

FIG. 6 illustrates signal waveforms associated with operation of the control circuit 530 shown in FIG. 5 in accordance with some embodiments of the present disclosure. Referring to FIG. 6 and also to FIG. 5, at time t0', the enable signal EN_D transitions to a high signal level. After the time delay TD introduced by the delay element 358, i.e. at time t1', the enable signal EN_D may transition to a high signal level. The comparator circuit 120 can enter the comparison cycle $CC_1$. Before the comparator output $C_{OUT}$ generated in the comparison cycle $CC_1$ becomes valid, the latch stage 542.1 can be triggered because the control signal CKS has transitioned to a low signal level.

At time t2', the signal level difference between the voltage signals VOP and VON reaches a threshold level. As the latch stage 542.1 has been triggered, the data latch 344.1 can immediately store the comparator output $C_{OUT}$ which reaches a valid logic state, and the signal detector 346.1 can generate the valid signal CKO[3] at a high signal level at time t2v'. When a time delay TD2 introduced by the delay element 549.1 has elapsed after the level transition of the valid signal CKO[3], the delay element 549.1 can generate the trigger signal CKI[2] at a high signal level. The time delay TD2 may be equal to or longer than the time delay TD, and may be shorter than two times the time delay TD.

In addition, when the signal level difference between the voltage signals VOP and VON reaches the threshold level, the enable signal EN may transition to a low signal level. After the time delay TD, i.e. at time t3', the enable signal EN_D may transition to a low signal level in response to the enable signal EN. The comparator circuit 120 may reset the comparator output $C_{OUT}$ according to the enable signal EN_D, such that the voltage signals VOP and VON may be at a same signal level. The enable signal EN may transition to a high signal level. After the time delay TD, i.e. at time t4', the enable signal EN_D may transition to a high signal level. The comparator circuit 120 can enter the comparison cycle $CC_2$.

As the latch stage 542.2 can be trigged in response to the valid signal CKO[3] outputted from the preceding latch stage 542.1, SAR control logic implemented based on the structure of the latch circuits 540.1-540.4 can be referred to as single-path SAR control logic. As those skilled in the art can understand operation of the control circuit 530 in the comparison cycles $CC_2$-$CC_4$ after reading the above paragraphs directed to FIG. 1 to FIG. 6, similar description is not repeated here for brevity.

In some embodiments, a latch stage can perform self-latching operation to thereby keep a comparator output, which has been stored therein in a previous comparison cycle, from being disturbed by a comparator output generated in a current comparison cycle. For example, when another latch stage following the latch stage is triggered in response to a trigger signal to store the comparator output generated in the current comparison cycle, the latch stage can be uncoupled from the comparator output generated in the current comparison cycle.

Figure 7A:
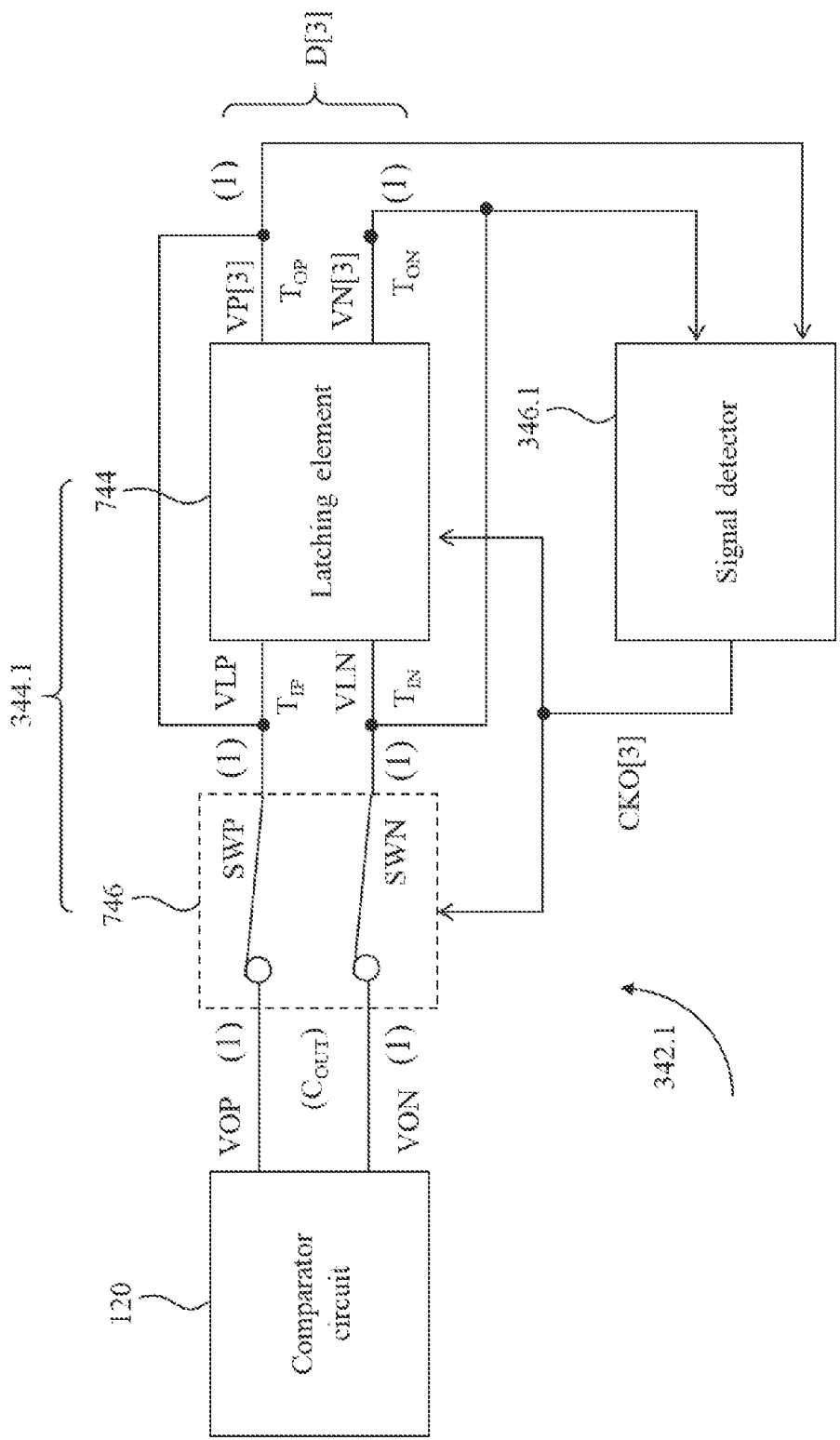
FIG. 7A to FIG. 7C illustrate exemplary self-latching operation of the latch stage shown in FIG. 3 in accordance with some embodiments of the present disclosure.
Figure 7B:
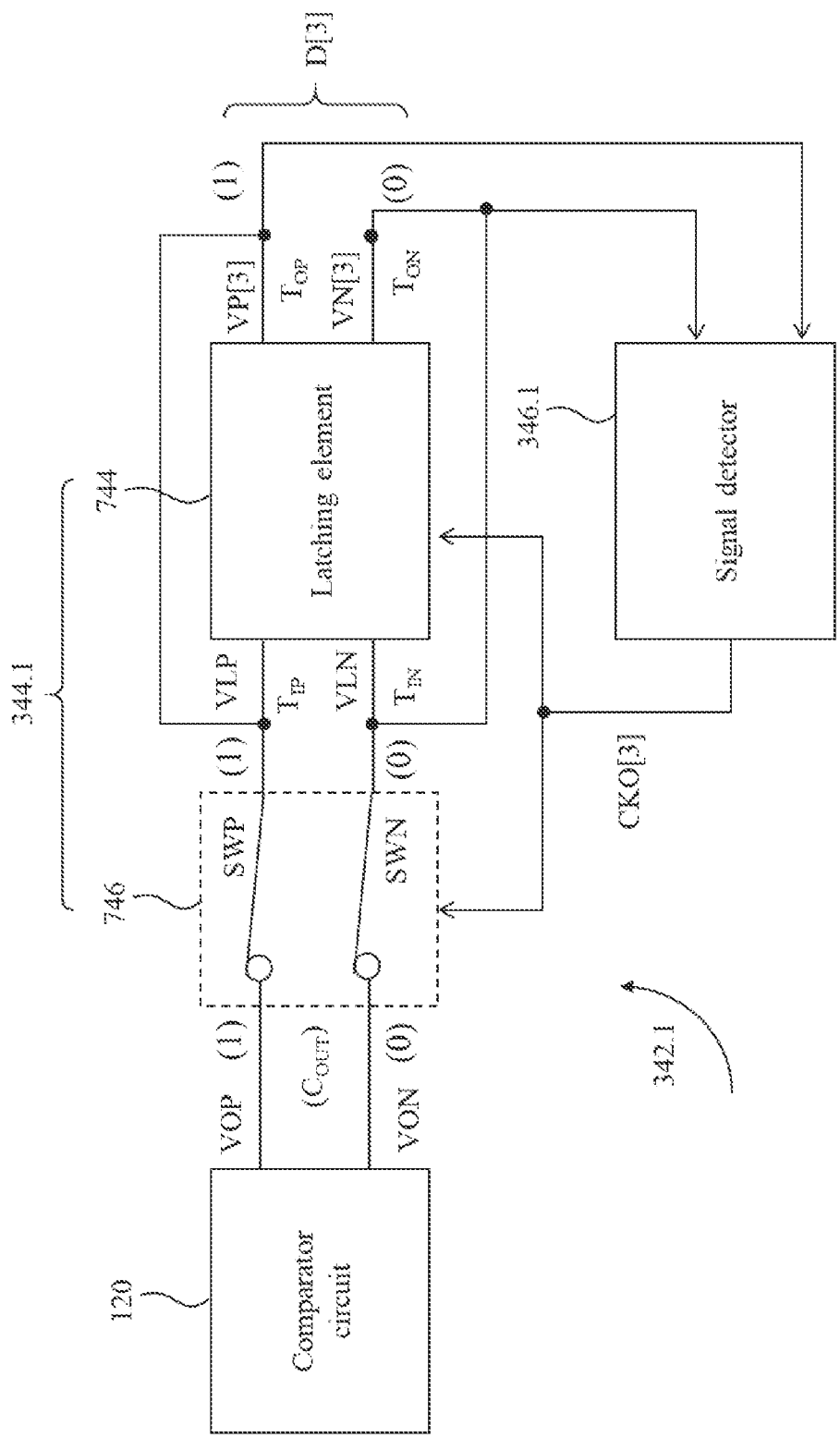
Figure 7C:
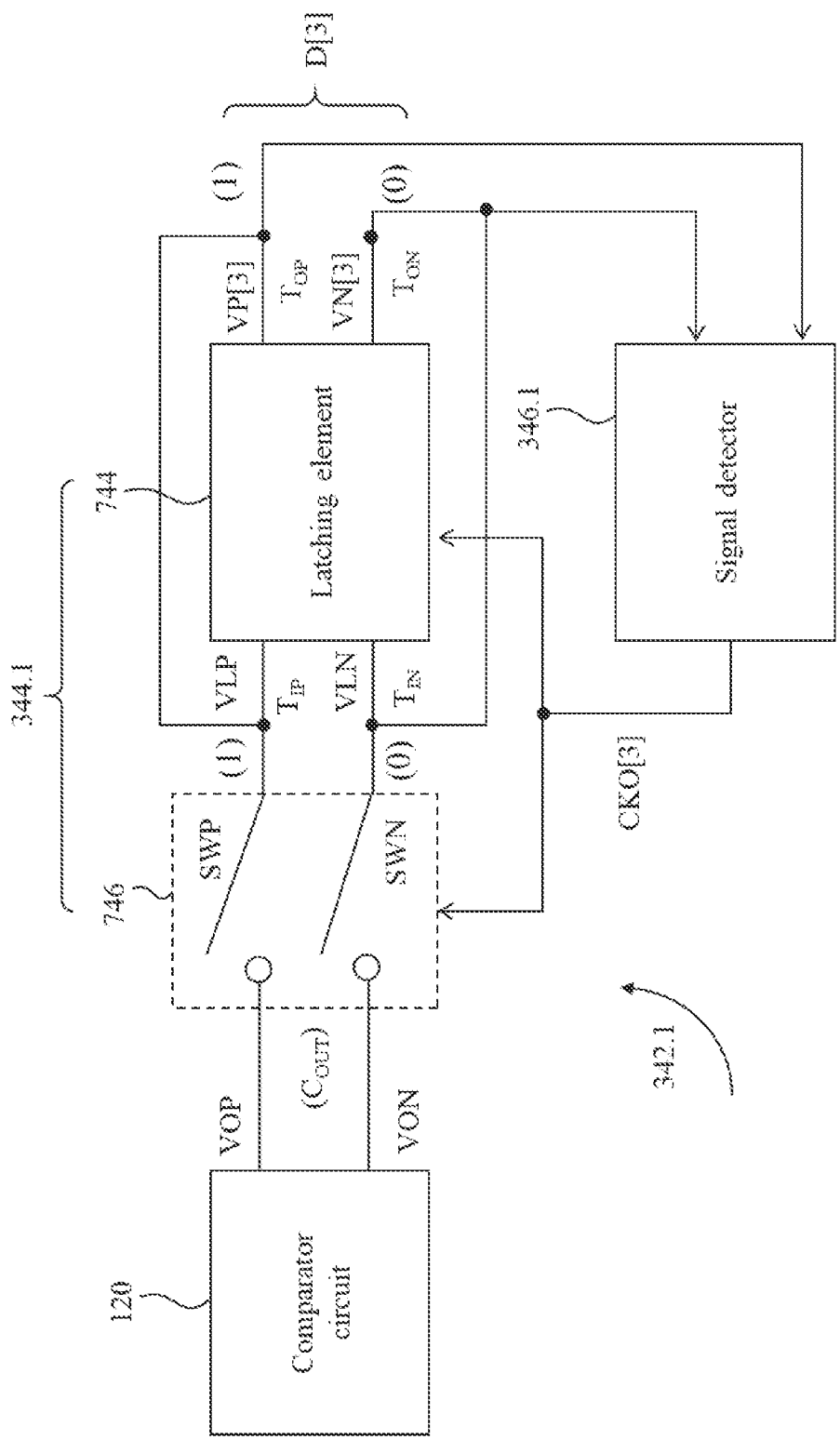

FIG. 7A to FIG. 7C illustrate exemplary self-latching operation of the latch stage 342.1 shown in FIG. 3 in accordance with some embodiments of the present disclosure. Referring firstly to FIG. 7A, the data latch 344.1 of the latch stage 342.1 may include a latching element 744 and a switch circuit 746. The latching element 744 includes a plurality of input terminals $T_{IP}$ and $T_{IN}$, and a plurality of output terminals $T_{OP}$ and $T_{ON}$. The input terminal $T_{IP}$ is coupled to the output terminal $T_{OP}$, and the input terminal $T_{IN}$ is coupled to the output terminal $T_{ON}$. The latching element 744 can be configured to operate in different modes according to the valid signal CKO[3] outputted from the signal detector 346.1. For example, the latching element 744 may operate in a bypass mode where a data latching function thereof is disabled. As another example, the latching element 744 may operate in a latch mode where the data latching function thereof is enabled.

The switch circuit 746 is configured to selectively couple the comparator output $C_{OUT}$ to the latching element 744 according to the valid signal CKO[3]. In the present embodiment, the switch circuit 746 includes plurality of switches SWP and SWN. The switch SWP is selectively coupled between the voltage signal VOP and the input terminal $T_{IP}$. The switch SWN is selectively coupled between the voltage signal VON and the input terminal $T_{IN}$.

In operation, the comparator output $C_{OUT}$ is reset during a reset period, such as a period of time from time t0 to time t1 shown in FIG. 4. Each of the voltage signals VOP and VON is reset to a high signal level. The switches SWP and SWN are turned on according to the valid signal CKO[3]. The latching element 744 may operate in the bypass mode.

As a result, each of the voltage signal VLP at the input terminal $T_{IP}$ and the voltage signal VP[3] at the output terminal Tor is set to a high signal level. Each of the voltage signal VLN at the input terminal $T_{IN}$ and the voltage signal VN[3] at the output terminal $T_{ON}$ is set to a high signal level. The data signal D[3] is invalid. In addition, at the beginning of a sampling period such as a period of time from time t1 to time t2 shown in FIG. 4, each of the voltage signals VOP, VON, VLP, VLN, VP[3] and VN[3] may stay at a high signal level.

Next, referring to FIG. 7B, the comparator output $C_{OUT}$ becomes valid when the signal level of the voltage signal VON transition to a low signal level, such as at time t2 shown in FIG. 4. Each of the voltage signals VLN and VN[3] will transition to a low signal level. Referring to FIG. 7C, when the voltage signal VN[3] transition to a low signal level, such as time t2v shown in FIG. 4, the valid signal CKO[3] may transition to a high signal level to turn off each of the switches SWP and SWN. The latching element 744 may operate in the latch mode. As the switches SWP and SWN are turned off, the latch stage 342.1 can be uncoupled from the comparator output $C_{OUT}$ generated in a next comparison cycle.

Figure 8:
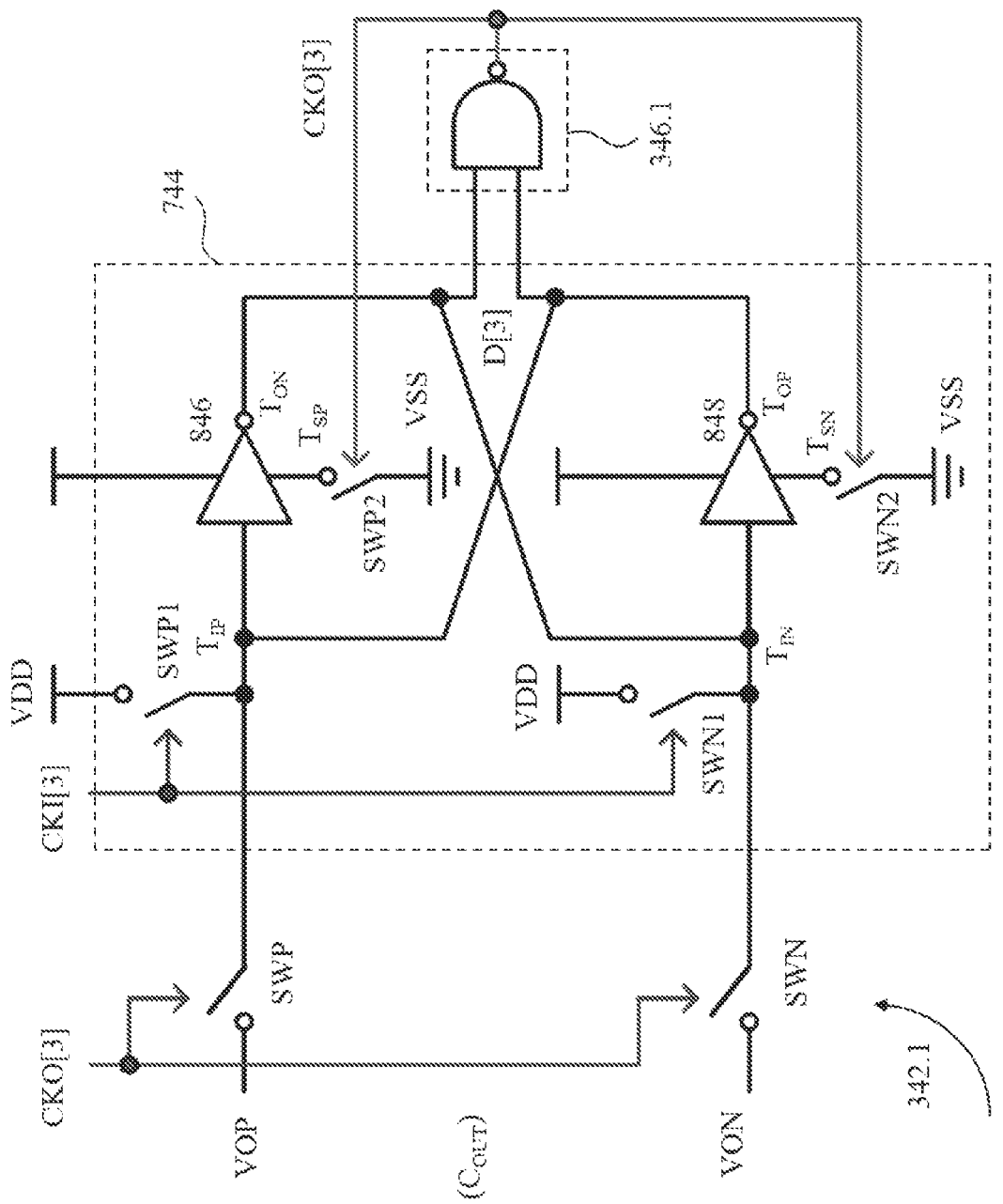
FIG. 8 illustrates an implementation of the latching element shown in FIG. 7A to FIG. 7C in accordance with some embodiments of the present disclosure.

FIG. 8 illustrates an implementation of the latching element 744 shown in FIG. 7A to FIG. 7C in accordance with some embodiments of the present disclosure. In the present embodiment, the latching element 744 includes a pair of cross-coupled inverters, and a plurality of switches SWP1, SWN1, SWP2 and SWN2. The pair of cross-coupled inverters, including inverters 846 and 848, is configured to store the comparator output $C_{OUT}$ to generate the data signal D[3]. An input terminal of the inverter 846 serves as the input terminal $T_{IP}$, and an output terminal of the inverter 846 serves as the output terminal $T_{ON}$. An input terminal of the inverter 848 serves as the input terminal $T_{IN}$, and an output terminal of the inverter 848 serves as the output terminal Top.

The switch SWP1 is selectively coupled between a reference voltage VDD and the input terminal $T_{IP}$ according to the trigger signal CKI[3] shown in FIG. 3. The switch SWN1 is selectively coupled between the reference voltage VDD and the input terminal $T_{IN}$ according to the trigger signal CKI[3]. The switch SWP2 is selectively coupled between a supply terminal Tsp of the inverter 846 and a reference voltage VSS according to the valid signal CKO[3]. The switch SWN2 is selectively coupled between a supply terminal $T_{SN}$ of the inverter 848 and the reference voltage VSS according to the valid signal CKO[3].

Figure 9A:
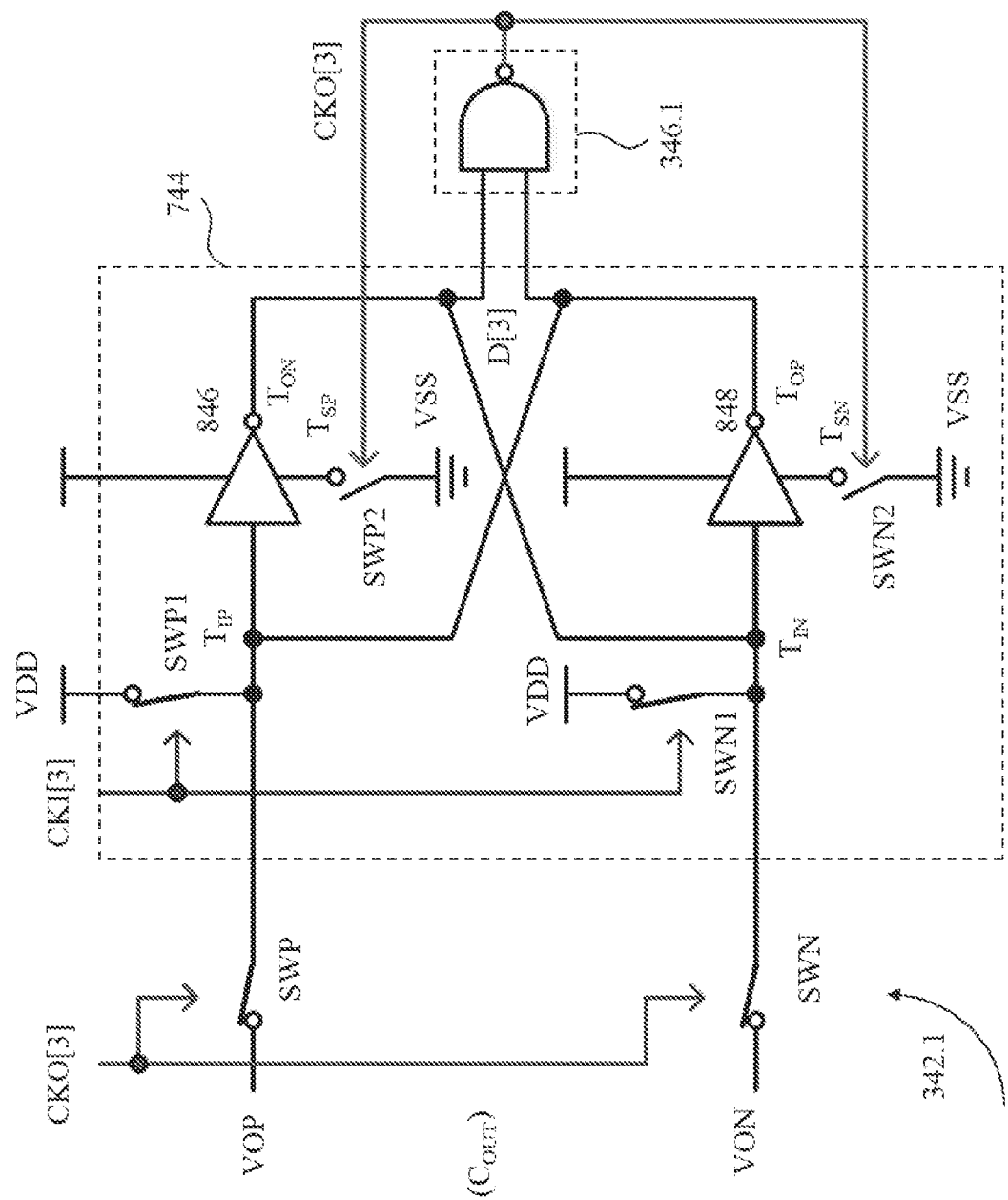
FIG. 9A to FIG. 9C illustrate exemplary self-latching operation of the latch stage 342.1 shown in FIG. 8 in accordance with some embodiments of the present disclosure.
Figure 9B:
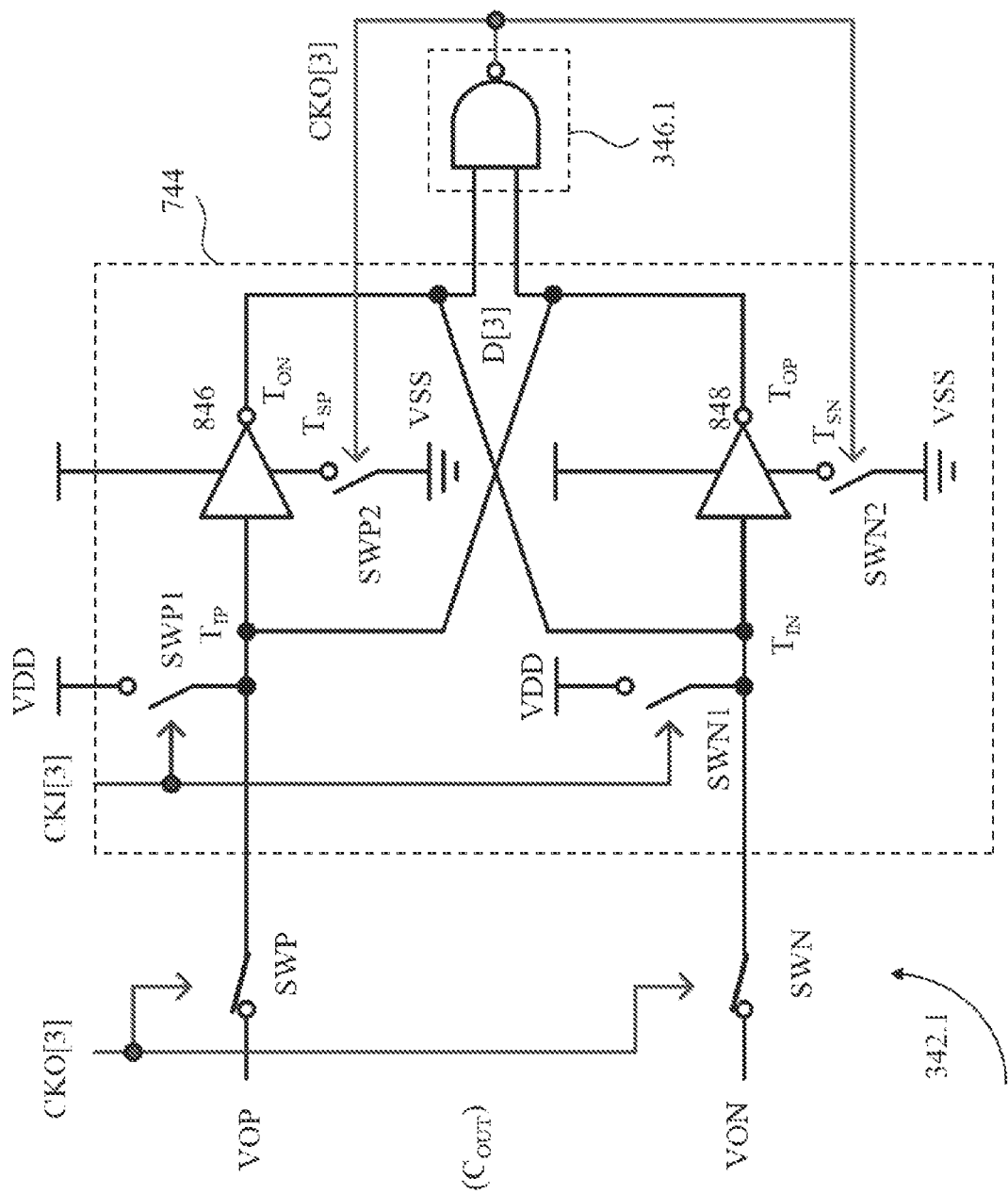
Figure 9C:
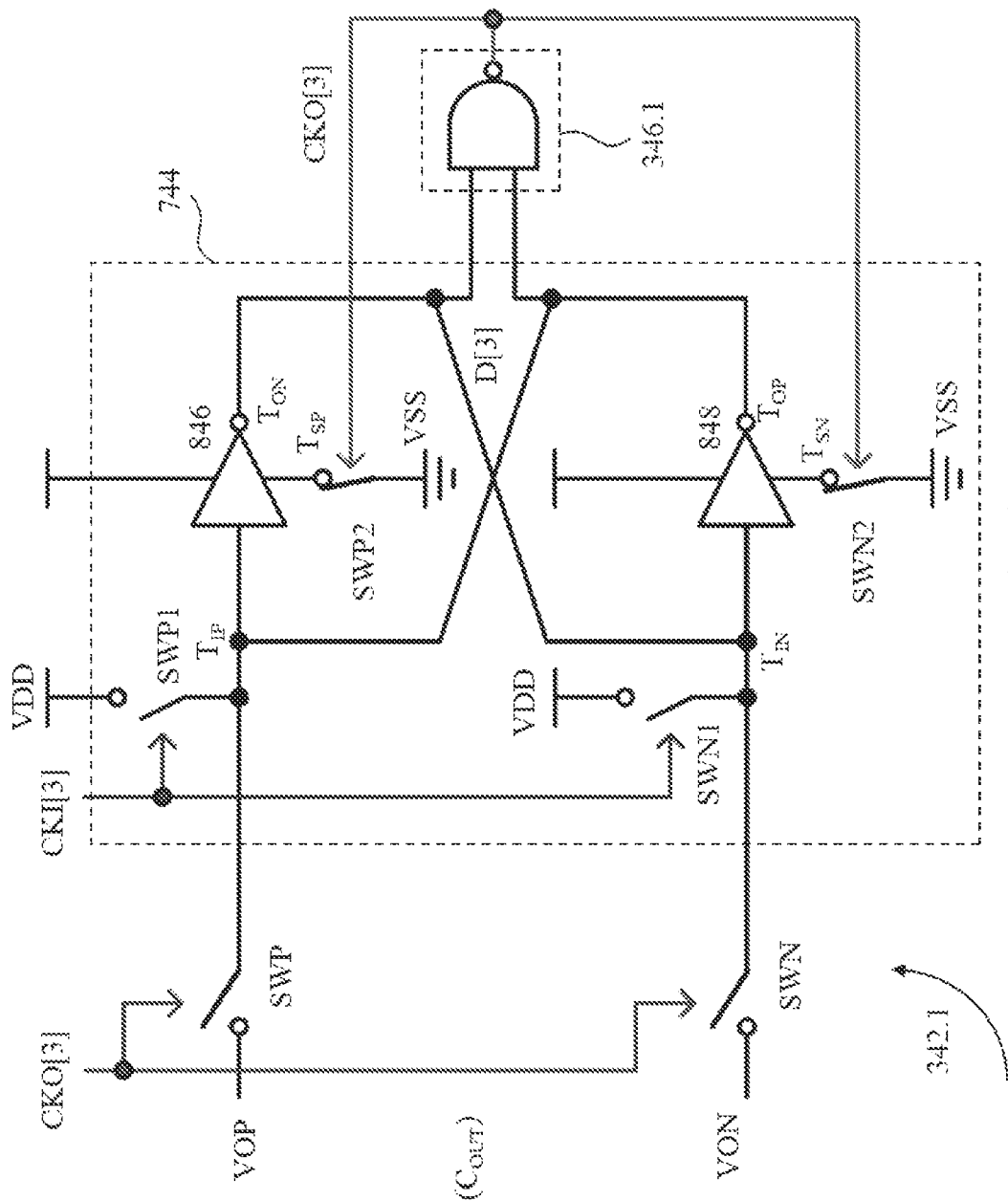

FIG. 9A to FIG. 9C illustrate exemplary self-latching operation of the latch stage 342.1 shown in FIG. 8 in accordance with some embodiments of the present disclosure. Referring firstly to FIG. 9A, each of the switches SWP1 and SWN1 is turned on according to the trigger signal CKI[3] during a reset period, such as a period of time before time t0 shown in FIG. 4. Each of the switches SWP2 and SWN2 is turned off, and each of the switches SWP and SWN is turned on. The latching element 744 may operate in the bypass mode.

Referring to FIG. 9B, each of the switches SWP1 and SWN1 is turned off according to the trigger signal CKI[3] during a sampling period. As the data signal D[3] is invalid at the beginning of the sampling period, such as a period of time from time t0 to time t2 shown in FIG. 4, each of the switches SWP2 and SWN2 is turned off according to the valid signal CKO[3]. Additionally, each of the switches SWP and SWN is turned on according to the valid signal CKO[3].

Referring to FIG. 9C, when the data signal D[3] becomes valid, such as time t2v shown in FIG. 4, the valid signal CKO[3] may transition to a high signal level. The latching element 744 may operate in the latch mode. Each of the switches SWP2 and SWN2 is turned on to latch the data signal D[3]. Each of the switches SWP and SWN is turned off to uncouple the voltage signals VOP and VON from the latch element 744. The latch stage 342.1 is uncoupled from the comparator output $C_{OUT}$.

It is worth noting that the structure and operation described with reference to FIG. 7A through FIG. 9C can be used to implement at least one of the latch stages 342.2-342.4 shown in FIG. 3 and the latch stages 542.1-542.4 shown in FIG. 5 without departing from the scope of the present disclosure. Additionally, the circuit structure shown in FIG. 8 is provided for illustrative purposes, and is not intended to limit the scope of the present disclosure.

Figure 10:
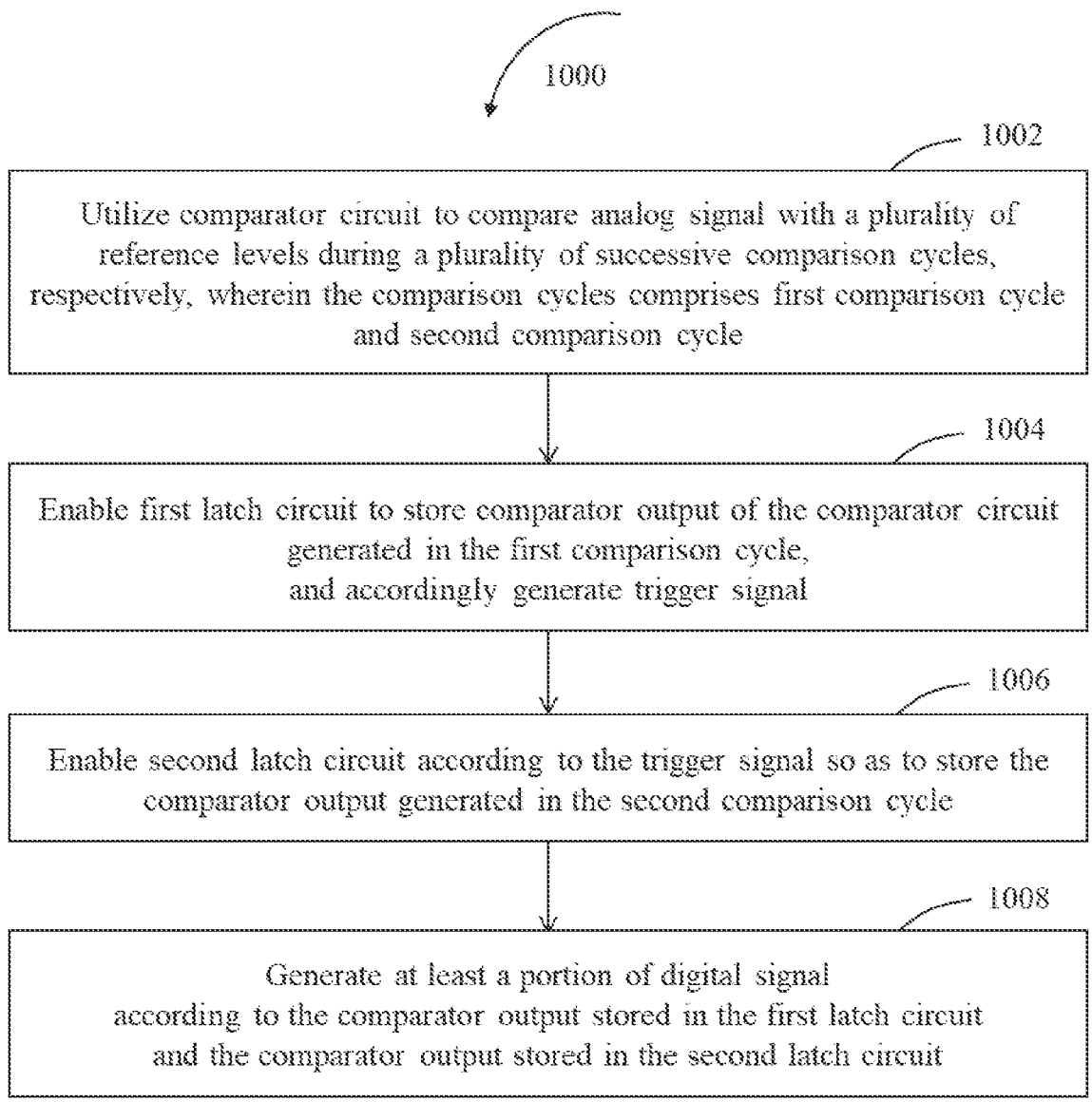
FIG. 10 is a flow chart of an exemplary method for operating a SAR ADC circuit in accordance with some embodiments of the present disclosure.

FIG. 10 is a flow chart of an exemplary method for operating a SAR ADC circuit in accordance with some embodiments of the present disclosure. The method 1000 is described with reference to the control circuit 330 shown in FIG. 3 for illustrative purposes. Those skilled in the art should appreciate that the method 1000 can be employed in the control circuit 130 shown in FIG. 1 and the control circuit 530 shown in FIG. 5 without departing from the scope of the present disclosure. Additionally, in some embodiments, other operations in the method 1000 can be performed. In some embodiments, operations of the method 1000 can be performed in a different order and/or vary.

At operation 1002, a comparator circuit of the SAR ADC circuit is utilized to compare an analog signal with a plurality of reference levels during a plurality of successive comparison cycles, respectively. The comparison cycles include a first comparison cycle and a second comparison cycle. For example, the comparator circuit 120 is configured to compare the analog signal $A_{IN}$ with a plurality of reference levels during the comparison cycles $CC_1$-$CC_4$.

At operation 1004, a first latch circuit is enabled to store a comparator output of the comparator circuit generated in the first comparison cycle, and a trigger signal is generated accordingly. For example, the latch circuit 340.1 is enabled to store the comparator output $C_{OUT}$ generated in the comparison cycle CC, and accordingly generate the trigger signal TG[2].

At operation 1006, a second latch circuit is enabled according to the trigger signal so as to store the comparator output generated in the second comparison cycle. For example, the latch circuit 340.2 is enabled according to the trigger signal TG[2] so as to store the comparator output $C_{OUT}$ generated in the comparison cycle $CC_2$.

At operation 1008, at least a portion of a digital signal is generated according to the comparator output latched into the first latch circuit and the comparator output latched into the second latch circuit. For example, a portion of the digital signal $D_{OUT}$ is generated according to the comparator output $C_{OUT}$ generated in the comparison cycle $CC_1$ and the comparator output $C_{OUT}$ generated in the comparison cycle $CC_2$.

In some embodiments, the first latch circuit can be enabled before the comparator output generated in the first comparison cycle becomes valid. For example, the latch circuit 340.1 can be enabled before the comparison cycle $CC_1$ starts. As those skilled in the art can appreciate operation of the method 1000 after reading the above paragraphs directed to FIG. 1 through FIG. 9C, further description is omitted here for brevity.

With the use of the proposed SAR control scheme, a latch circuit can be configured to trigger a next latch circuit according to a data signal latched therein. The next latch circuit can be triggered before a comparator output to be stored becomes valid. As a result, the proposed SAR control scheme can give more time margin to the DAC settling time.

As used herein, the terms "substantially" are used to describe and account for small variations. When used in conduction with an event or circumstance, the terms can refer to instances in which the event of circumstance occurs precisely as well as instances in which the event or circumstance occurs to a close approximation. As used herein with respect to ta given value or range, the term "substantially" generally means within ±10%, +5%, +1%, or ±0.5% of the given value or range. Ranges can be expressed herein as from one endpoint to another endpoint or between two endpoints. All ranges disclosed herein are inclusive of the endpoints, unless specified otherwise. In addition, when referring to numerical values or characteristics as "substantially" the same, the term can refer to the values lying within ±10%, f5%, ±1%, or f0.5% of an average of the values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A successive-approximation register (SAR) analog-to-digital converter (ADC) circuit, comprising:
    a comparator circuit, configured to compare an analog signal with a plurality of reference levels; and
    a plurality of latch circuits, coupled to the comparator circuit and connected in series, the latch circuits being triggered sequentially in response to a plurality of trigger signals, respectively, to store a comparator output of the comparator circuit and accordingly generate a digital signal, wherein a first latch circuit and a second latch circuit of the latch circuits are triggered in response to a first trigger signal and a second trigger signal of the trigger signals, respectively; the first latch circuit is configured to generate the second trigger signal according to the comparator output stored in the first latch circuit wherein the first latch circuit comprises: a data latch configured to, when triggered in response to the first trigger signal, store the comparator output to generate a data signal; a signal detector, coupled to the data latch, the signal detector being configured to detect the data signal to generate a first valid signal indicating if the data signal is valid; and a delay element, coupled to the signal detector, the delay element being configured to delay the first valid signal to generate the second trigger signal.

2. The SAR ADC circuit of claim 1, wherein the comparator circuit is configured to compare the analog signal with the reference levels in a plurality of comparison cycles, respectively; the latch circuits are configured to store comparator output generated in the comparison cycles, respectively; at least one of the latch circuits is triggered before the comparator output generated in a corresponding comparison cycle becomes valid.

3. The SAR ADC circuit of claim 1, wherein when the second latch circuit is triggered in response to the second trigger signal to store the comparator output, the first latch circuit is uncoupled from the comparator output.

4. The SAR ADC circuit of claim 1, wherein the comparator output comprises a first voltage signal and a second voltage signal; the data latch comprises:
    a pair of cross-coupled inverters, configured to store the comparator output to generate the data signal, the pair of cross-coupled inverters comprising a first inverter and a second inverter, an input terminal of the first inverter being coupled to an output terminal of the second inverter, an input terminal of the second inverter being coupled to an output terminal of the first inverter;
    a first switch, selectively coupled between the first voltage signal and the input terminal of the first inverter according to the first valid signal;
    a second switch, selectively coupled between the second voltage signal and the input terminal of the second inverter according to the first valid signal;
    a third switch, selectively coupled between a first reference voltage and the input terminal of the first inverter according to the first trigger signal;
    a fourth switch, selectively coupled between the first reference voltage and the input terminal of the second inverter according to the first trigger signal;
    a fifth switch, selectively coupled between a supply terminal of the first inverter and a second reference voltage according to the first valid signal; and
    a sixth switch, selectively coupled between a supply terminal of the second inverter and the second reference voltage according to the first valid signal.

5. The SAR ADC circuit of claim 4, wherein when each of the third switch and the fourth switch is turned on, each of the fifth switch and the sixth switch is turned off, and each of the first switch and the second switch is turned off; when each of the third switch, the fourth switch, the fifth switch and the sixth switch is turned off, each of the first switch and the second switch is turned on; when each of the third switch and the fourth switch is turned off, and each of the fifth switch and the sixth switch is turned on, each of the first switch and the second switch is turned off.

6. The SAR ADC circuit of claim 1, wherein the data signal comprises a first voltage signal and a second voltage signal; the signal detector is a NAND gate configured to receive the first voltage signal and the second voltage signal to generate the first valid signal.

7. The SAR ADC circuit of claim 1, wherein the delay element is a flip-flop triggered in response to a second valid signal indicating if the comparator output is valid; when the second valid signal indicates that the comparator output becomes invalid, the flip-flop is configured to output the second trigger signal according to the first valid signal.

8. The SAR ADC circuit of claim 7, wherein the flip-flop is reset when the analog signal is sampled by the comparator circuit.

9. The SAR ADC circuit of claim 1, wherein the second latch circuit is configured to generate a least significant bit of the digital signal according to the comparator output; the second latch circuit comprises:
    a data latch configured to, when triggered in response to the second trigger signal, store the comparator output to generate a data signal; and
    a signal detector, coupled to the data latch, the signal detector being configured to detect the data signal to generate a valid signal indicating if the data signal is valid;

wherein when the valid signal indicates that the data signal is valid, the comparator circuit is configured to reset the comparator output according to the valid signal.

10. The SAR ADC circuit of claim 9, wherein the data signal comprises a first voltage signal and a second voltage signal; the signal detector is a NAND gate configured to receive the first voltage signal and the second voltage signal to generate the valid signal.

11. The SAR ADC circuit of claim 1, wherein the first latch circuit is configured to generate a most significant bit of the digital signal according to the comparator output; the first trigger signal is a control signal for controlling sampling of the analog signal; when the control signal indicates that the sampling of the analog signal is performed, the first latch circuit is untriggered; when the control signal indicates that the sampling of the analog signal is finished, the first latch circuit is triggered.

12. The SAR ADC circuit of claim 1, further comprising:
a signal detector, coupled to the comparator circuit and the first latch circuit, the signal detector being configured to detect the comparator output to generate a valid signal, the valid signal indicating if the comparator output is valid;
wherein the first latch circuit is configured to send out the second trigger signal to the second latch circuit according to the valid signal; when the valid signal indicates that the comparator output is valid, the second trigger signal is not sent out to the second latch circuit; when the valid signal indicates that the comparator output becomes invalid, the second trigger signal is sent out to the second latch circuit.

13. A successive-approximation register (SAR) analog-to-digital converter (ADC) circuit, comprising:
a comparator circuit, configured to compare an analog signal with N reference levels in N comparison cycles respectively, N being an integer greater than one;
N latch stages, coupled to the comparator circuit, the N latch stages being configured to store a comparator output of the comparator circuit generated in the N comparison cycles as N data signals respectively, and accordingly generate a digital signal, wherein each latch stage is configured to output a first valid signal indicating if the data signal stored in the latch stage is valid; and
(N−1) delay stages, wherein each delay stage is coupled between two consecutive latch stages of the N latch stages, and configured to delay the first valid signal outputted from one of the two consecutive latch stages to generate a trigger signal, and trigger the other of the two consecutive latch stages according to the trigger signal.

14. The SAR ADC circuit of claim 13, wherein at least one of the N latch stages is triggered before the data signal generated in a corresponding comparison cycle becomes valid.

15. The SAR ADC circuit of claim 13, wherein when the other of the two consecutive latch stages is triggered in response to the trigger signal to store the comparator output, the one of the two consecutive latch stages is uncoupled from the comparator output.

16. The SAR ADC circuit of claim 13, wherein the latch stage comprises:
a data latch, configured to store the comparator output to generate the data signal, the data signal comprising a first voltage signal and a second voltage signal; and
a signal detector, coupled to the data latch, the signal detector being configured to generate the first valid signal by detecting if a signal level difference between the first voltage signal and the second voltage signal reaches a threshold level, wherein when the signal level difference between the first voltage signal and the second voltage signal reaches the threshold level, the first valid signal indicates that the data signal stored in the latch stage is valid.

17. The SAR ADC circuit of claim 13, wherein the delay stage is a flip-flop triggered in response to a second valid signal indicating if the comparator output of the comparator circuit is valid; when the second valid signal indicates that the comparator output becomes invalid, the flip-flop is configured to output the trigger signal according to the valid signal.

18. A method for operating a successive-approximation register (SAR) analog-to-digital converter (ADC) circuit, comprising:
utilizing a comparator circuit of the SAR ADC circuit to compare an analog signal with a plurality of reference levels during a plurality of successive comparison cycles, respectively, wherein the comparison cycles comprises a first comparison cycle and a second comparison cycle;
enabling a first latch circuit to store a comparator output of the comparator circuit generated in the first comparison cycle and accordingly generate a trigger signal;
enabling a second latch circuit according to the trigger signal so as to store the comparator output generated in the second comparison cycle; and
generating at least a portion of a digital signal according to the comparator output stored in the first latch circuit and the comparator output stored in the second latch circuit wherein the first latch circuit comprises: a data latch configured to, when triggered in response to the first trigger signal, store the comparator output to generate a data signal; a signal detector, coupled to the data latch, the signal detector being configured to detect the data signal to generate a first valid signal indicating if the data signal is valid; and a delay element, coupled to the signal detector, the delay element being configured to delay the first valid signal to generate the second trigger signal.

19. The method of claim 18, wherein the first latch circuit is enabled before the comparator output generated in the first comparison cycle becomes valid.

* * * * *